US009020814B2

(12) United States Patent
Ma et al.

(10) Patent No.: US 9,020,814 B2
(45) Date of Patent: Apr. 28, 2015

(54) PULSE ENCODING AND DECODING METHOD AND PULSE CODEC

(71) Applicant: Huawei Technologies Co., Ltd., Shenzhen (CN)

(72) Inventors: Fuwei Ma, Shenzhen (CN); Dejun Zhang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/725,301

(22) Filed: Dec. 21, 2012

(65) Prior Publication Data

US 2013/0124199 A1 May 16, 2013

Related U.S. Application Data

(63) Continuation of application No. PCT/CN2011/074999, filed on May 31, 2011.

(30) Foreign Application Priority Data

Jun. 24, 2010 (CN) .......................... 2010 1 0213451

(51) Int. Cl.
*G10L 19/02* (2013.01)
*G10L 19/00* (2013.01)
(Continued)

(52) U.S. Cl.
CPC ................. *G10L 19/00* (2013.01); *G10L 19/12* (2013.01); *G10L 19/24* (2013.01); *G10L 19/107* (2013.01)
USPC ........... 704/219; 704/203; 704/212; 704/226; 704/500; 341/50; 375/240

(58) Field of Classification Search
USPC ...................... 704/219, 500; 375/240; 341/50
See application file for complete search history.

(56) References Cited

U.S. PATENT DOCUMENTS 4,631,521 A * 12/1986 El-Sherbini .................. 382/244
8,280,729 B2 * 10/2012 Yu et al. ........................ 704/219
(Continued)

FOREIGN PATENT DOCUMENTS

CN 101295506 A 10/2008
CN 101388210 A 3/2009
(Continued)

OTHER PUBLICATIONS

ETSI TS 126 190 V9.0.0 (Jan. 2010). Digital cellular telecommunications system (Phase 2+); Universal Mobile Telecommunications System (UMTS); LTE; Speech codec speech processing functions; Adaptive Multi-Rate-Wideband (AMR-WB) speech codec; Transcoding functions (3GPP TS 26.190 version 9.0.0 Release 9).*
(Continued)

*Primary Examiner* — Matthew Baker
(74) *Attorney, Agent, or Firm* — Huawei Technologies Co., Ltd.

(57) ABSTRACT

In a pulse encoding and decoding method and a pulse codec, more than two tracks are jointly encoded, so that free codebook space in the situation of single track encoding can be combined during joint encoding to become code bits that may be saved. Furthermore, a pulse that is on each track and required to be encoded is combined according to positions, and the number of positions having pulses, distribution of the positions that have pulses on the track, and the number of pulses on each position that has a pulse are encoded separately, so as to avoid separate encoding performed on multiple pulses of a same position, thereby further saving code bits.

27 Claims, 10 Drawing Sheets

(51) Int. Cl.

| | |
|---|---|
| ***G10L 21/00*** | (2013.01) |
| ***G10L 21/04*** | (2013.01) |
| ***H03M 7/00*** | (2006.01) |
| ***H04B 1/66*** | (2006.01) |
| ***G10L 19/107*** | (2013.01) |
| *G10L 19/12* | (2013.01) |
| *G10L 19/24* | (2013.01) |

(56) References Cited

U.S. PATENT DOCUMENTS

| | | | | |
|---|---|---|---|---|
| 8,294,602 | B2 * | 10/2012 | Ma et al. | 341/50 |
| 2002/0111799 | A1 | 8/2002 | Bernard | |
| 2004/0064310 | A1 * | 4/2004 | Banba et al. | 704/212 |
| 2004/0093368 | A1 | 5/2004 | Lee et al. | |
| 2005/0065785 | A1 | 3/2005 | Bessette | |
| 2005/0228653 | A1 | 10/2005 | Morii | |
| 2005/0267746 | A1 * | 12/2005 | Jelinek et al. | 704/226 |
| 2009/0043572 | A1 | 2/2009 | Teo et al. | |
| 2009/0234644 | A1 * | 9/2009 | Reznik et al. | 704/203 |
| 2009/0240491 | A1 * | 9/2009 | Reznik | 704/219 |
| 2009/0240493 | A1 | 9/2009 | Zhang | |
| 2010/0280831 | A1 * | 11/2010 | Salami et al. | 704/500 |
| 2011/0004466 | A1 | 1/2011 | Morii | |
| 2011/0026581 | A1 * | 2/2011 | Ojala et al. | 375/240 |
| 2011/0184733 | A1 * | 7/2011 | Yu et al. | 704/219 |
| 2012/0086586 | A1 | 4/2012 | Ma et al. | |
| 2013/0021177 | A1 | 1/2013 | Ma et al. | |

FOREIGN PATENT DOCUMENTS

| | | | |
|---|---|---|---|
| CN | 101483043 | A | 7/2009 |
| CN | 101931414 | A | 12/2010 |
| EP | 2157573 | A1 | 2/2010 |
| JP | 2004514182 | A | 5/2004 |
| JP | 2004163737 | A | 6/2004 |
| JP | 2008533522 | A | 8/2008 |
| JP | 2010526325 | A | 7/2010 |
| WO | 2006085586 | A1 | 8/2006 |
| WO | 2006096099 | A1 | 9/2006 |
| WO | 2008134974 | A1 | 11/2008 |
| WO | 2009116280 | A1 | 9/2009 |

OTHER PUBLICATIONS

International Search Report issued in corresponding PCT Patent Application No. PCT/CN2011/074999, mailed Sep. 8, 2011.

Written Opinion of the International Searching Authority issued in corresponding PCT Patent Application No. PCT/CN2011/074999, mailed Sep. 8, 2011.

First office action issued in corresponding Chinese patent application 201010213451.5, dated May 6, 2013, and English translation thereof, total 12 pages.

ETSI TS 126 090 V9.0.0, Digital cellular telecommunications system (Phase 2+);Universal Mobile Telecommunications System (UMTS);LTE;Mandatory Speech Codec speech processing functions;Adaptive Multi-Rate (AMR) speech codec;Transcoding functions(3GPP TS 26.090 version 9.0.0 Release 9), Jan. 2010, total 57 pages.

* cited by examiner

PULSE ENCODING AND DECODING METHOD AND PULSE CODEC

CROSS-REFERENCE TO RELATED APPLICATIONS

This application is a continuation of international Application No. PCT/CN2011/074999, filed on May 31, 2011, which claims priority to Chinese Patent Application No. 201010213451.5, filed on Jun. 24, 2010, both of which are hereby incorporated by reference in their entireties.

FIELD OF THE INVENTION

The present invention relates to a pulse encoding and decoding method and a pulse codec.

BACKGROUND OF THE INVENTION

In vector encoding technologies, an algebraic codebook is often used to perform quantization encoding on a residual signal after adaptive filtering. After position and symbol information of an optimal algebraic codebook pulse on a track is obtained through searching, a corresponding index value is obtained through encoding calculation, so that a decoding end can reconstruct a pulse sequence according to the index value. In a precondition that lossless reconstruction is ensured, bits required by a code index value are reduced as much as possible, which is one of major objectives of research and development of algebraic codebook pulse encoding methods.

A preferred encoding method, namely, the adaptive multi-rate wideband (AMR_WB+, Adaptive Multi-Rate Wideband) encoding method in speech encoding is taken as an example below to illustrate a specific encoding method adopted by an existing algebraic codebook pulse. According to different code bit rates, 1 to N pulses may be encoded on each track. It is assumed that each track has $M=2^m$ positions, in the AMR_WB+, processes of encoding 1 to 6 pulses on each track are respectively described as follows:

① One pulse is encoded on each track.

Each track has $2^m$ positions, therefore on each track, a position index of the pulse requires m bits for encoding, and a symbol index of the pulse requires 1 bit for encoding. An index value of 1 pulse with a symbol is encoded as:

$$I_{1p}(m)=p+s\times 2^m,$$

where $p\in[0, 2^m-1]$ is the position index of the pulse; s is the symbol index of the pulse; when a pulse symbol is positive, s is set as 0, and when the pulse symbol is negative, s is set as 1; $I_{1p}\in[0, 2^{m+1}-1]$.

The number of bits required for encoding 1 pulse on each track is: m+1.

② Two pulses are encoded on each track.

According to the result of ①, m+1 bits are required for encoding 1 pulse on each track, and encoding a position index of the other pulse requires m bits. Because there is no special requirement for order of the pulses, a value relationship obtained by arraying position indexes of the pulses may be used to indicate a symbol of the other pulse. An index value of 2 pulses is encoded as:

$$I_{2p}(m)=p1+I_{1p0}\times 2^m=p1+p0\times 2^m+s\times 2^{2m},$$

where p0, $p1\in[0, 2^m-1]$ are the position indexes of the 2 pulses respectively; s is a symbol index of a pulse p0; a specific symbol indication rule of a pulse p1 is: p0<p1 indicates that 2 pulse symbols are the same, p0>p1 indicates that 2 pulse symbols are opposite to each other; $I_{2p}\in[0, 2^{2m+1}-1]$.

The number of bits required for encoding 2 pulses on each track is: 2m+1.

③ Three pulses are encoded on each track.

Each track is divided into two sections: Section A and Section B. Each section individually includes $2^{m-1}$ positions. A certain section includes at least 2 pulses. According to the result of ②, 2×(m−1)+1=2m−1 bits are required for encoding the section. Another pulse is searched for on the whole track, and according to the result of ①, m+1 bits are required. In addition, 1 bit is further required to indicate the section including 2 pulses. An index value of 3 pulses is encoded as:

$$I_{3p}(m)=I_{2p}(m-1)+k\times 2^{2m-1}+I_{1p}(m)\times 2^{2m},$$

where k is an index of the Section; $I_{3p}\in[0, 2^{3m+1}-1]$.

The number of bits required for encoding 3 pulses on each track is: 3 m+1.

④ Four pulses are encoded on each track.

Each track is divided into two sections: Section A and Section B. Each section individually includes $2^{m-1}$ positions. Combinations of the numbers of pulses included in each section are as shown in the following table.

| Type | The number of pulses in Section A | The number of pulses in Section B | Required bits |
|---|---|---|---|
| 0 | 0 | 4 | 4m-3 |
| 1 | 1 | 3 | 4m-2 |
| 2 | 2 | 2 | 4m-2 |
| 3 | 3 | 1 | 4m-2 |
| 4 | 4 | 0 | 4m-3 |

In the foregoing table, bases of the required bits corresponding to each type are: For type 0 and type 4, in a section having 4 pulses, the method similar to that of ③ is adopted, but the number of pulses for overall searching is 2, which is equivalent to $I_{2p}(m-2)+k\times 2^{2m-3}+I_{2p}(m-1)\times 2^{2m-2}$; for type 1, it is equivalent to $I_{1p}(m-1)+I_{3p}(m-1)\times 2^m$; for type 2, it is equivalent to $I_{2p}(m-1)+I_{2p}(m-1)\times 2^{2m-1}$; and for type 3, it is equivalent to $I_{3p}(m-1)+I_{1p}(m-1)\times 2^{3m-2}$.

Type 0 and type 4 are regarded as a possible situation, and types 1 to 3 each are regarded as a situation, so that totally there are 4 situations, therefore 2 bits are required to indicate corresponding situations, and types 1 to 3 each require 4 m−2+2=4 m bits. Furthermore, for the situation including type 0 and type 4, 1 bit is further required for distinction, so that type 0 and type 4 require 4m−3+2+1=4 m bits.

The number of bits required for encoding 4 pulses on each track is: 4 m.

⑤ Five pulses are encoded on each track.

Each track is divided into two sections: Section A and Section B. Each section individually includes $2^{m-1}$ positions. A certain section includes at least 3 pulses. According to the result of ③, 3×(m−1)+1=3m−2 bits are required for encoding the section. The other two pulses are searched for on the whole track, and according to the result of ②, 2m+1 bits are required. In addition, 1 bit is further required to indicate the section including 3 pulses. An index value of 5 pulses is encoded as:

$$I_{5p}(m)=I_{3p}(m-1)+k\times 2^{3m-2}+I_{1p}(m)\times 2^{3m-1}.$$

The number of bits required for encoding 5 pulses on each track is: 5 m.

⑥ Six pulses are encoded on each track.

Each track is divided into two sections: Section A and Section B. Each section individually includes $2^{m-1}$ positions.

Combinations of the numbers of pulses included in each section are as shown in the following table.

| Type | The number of pulses in Section A | The number of pulses in Section B | Required bits |
|---|---|---|---|
| 0 | 0 | 6 | 6m-5 |
| 1 | 1 | 5 | 6m-5 |
| 2 | 2 | 4 | 6m-5 |
| 3 | 3 | 3 | 6m-4 |
| 4 | 4 | 2 | 6m-5 |
| 5 | 5 | 1 | 6m-5 |
| 6 | 6 | 0 | 6m-5 |

In the foregoing table, bases of the required bits corresponding to each type may be deduced according to ④, which is not repeatedly described.

Types 0 and 6, types 1 and 5, types 2 and 4 are each regarded as a possible situation, and type 3 is separately regarded as a situation, so that totally there are 4 situations, therefore 2 bits are required to indicate corresponding situations, and type 3 requires 6 m−4+2=6m−2 bits. For those situations including combined types, 1 bit is further required for distinction, so that other types, except for type 3, require 6 m−5+2+1=6 m−2 bits.

The number of bits required for encoding 6 pulses on each track is: 6 m−2.

In the process of proposing the present invention, the inventor finds that: In the algebraic pulse encoding method provided by the AMR_WB+, encoding logic similar to recursion is adopted, a situation in which the number of encoded pulses is relatively large is divided into several situations in which the number of encoded pulses is relatively small for processing, therefore calculation is complicated, and meanwhile, as the number of encoded pulses on the track increases, redundancy of code indexes accumulates gradually, which easily causes waste of code bits.

SUMMARY OF THE INVENTION

Embodiments of the present invention provide a pulse encoding method which is capable of saving code bits.

A pulse encoding method includes: obtaining pulses that are on T tracks and required to be encoded, where T is an integer greater than or equal to 2; separately collecting, according to positions, statistics about a pulse that is on each track and required to be encoded, to obtain the number $N_t$ of positions that have pulses on each track, distribution of the positions that have pulses on the track, and the number of pulses on each position that has a pulse, where the subscript t represents a $t^{th}$ track, and $t \in [0, T-1]$; according to the number $\{N_0, N_1, \ldots, N_{T-1}\}$ of positions that have pulses and are on each track, determining a first index I1, where the first index corresponds to all possible distribution situations of positions that have pulses and are on each track under the number of the positions having pulses, where the number of the positions having pulses is represented by it; determining a second index $\mathbf{I2}_t$ of each track separately according to distribution of the positions that have pulses on each track, where the second index indicates, among all possible distribution situations corresponding to the first index, a distribution situation which corresponds to distribution of current positions having pulses on a corresponding track; determining a third index $\mathbf{I3}_t$ of each track separately according to the number of pulses on each position that has a pulse and is on each track; and generating a code index Ind, where the code index includes information of the first index and the second and third indexes of each track.

Another pulse encoding method includes: obtaining pulses that are on T tracks and required to be encoded, where T is an integer greater than or equal to 2; separately collecting, according to positions, statistics about a pulse that is on each track and required to be encoded, to obtain the number $N_t$ of positions that have pulses on each track, distribution of the positions that have pulses on the track, and the number of pulses on each position that has a pulse, where the subscript t represents a $t^{th}$ track, and $t \in [0, T-1]$; according to the number of positions that have pulses and are on each track, determining a first index $\mathbf{I1}_t$ of each track, where the first index $\mathbf{I1}_t$ corresponds to all possible distribution situations of positions that have pulses and are on the track under the number of the positions having pulses, where the number of the positions having pulses is represented by it; determining a second index $\mathbf{I2}_t$ of each track separately according to distribution of the positions that have pulses on each track, where the second index indicates, among all possible distribution situations corresponding to the first index, a distribution situation which corresponds to distribution of current positions having pulses and is on the track; determining a third index $\mathbf{I3}_t$ of each track separately according to the number of pulses on each position that has a pulse and is on each track; and generating a code index Ind, where the code index includes information of the first, second, and third indexes of each track.

Embodiments of the present invention further provide a corresponding pulse decoding method, and a corresponding pulse encoder and decoder.

In the embodiments of the present invention, more than two tracks are jointly encoded, so that free codebook space in the situation of single track encoding can be combined during joint encoding to become code bits that may be saved. Furthermore, a pulse that is on each track and required to be encoded is combined according to positions, and the number of positions having pulses, distribution of the positions that have pulses on the track, and the number of pulses on each position that has a pulse are encoded separately, so as to avoid separate encoding performed on multiple pulses of a same position, thereby further saving code bits.

DETAILED DESCRIPTION OF THE EMBODIMENTS

Figure 1:
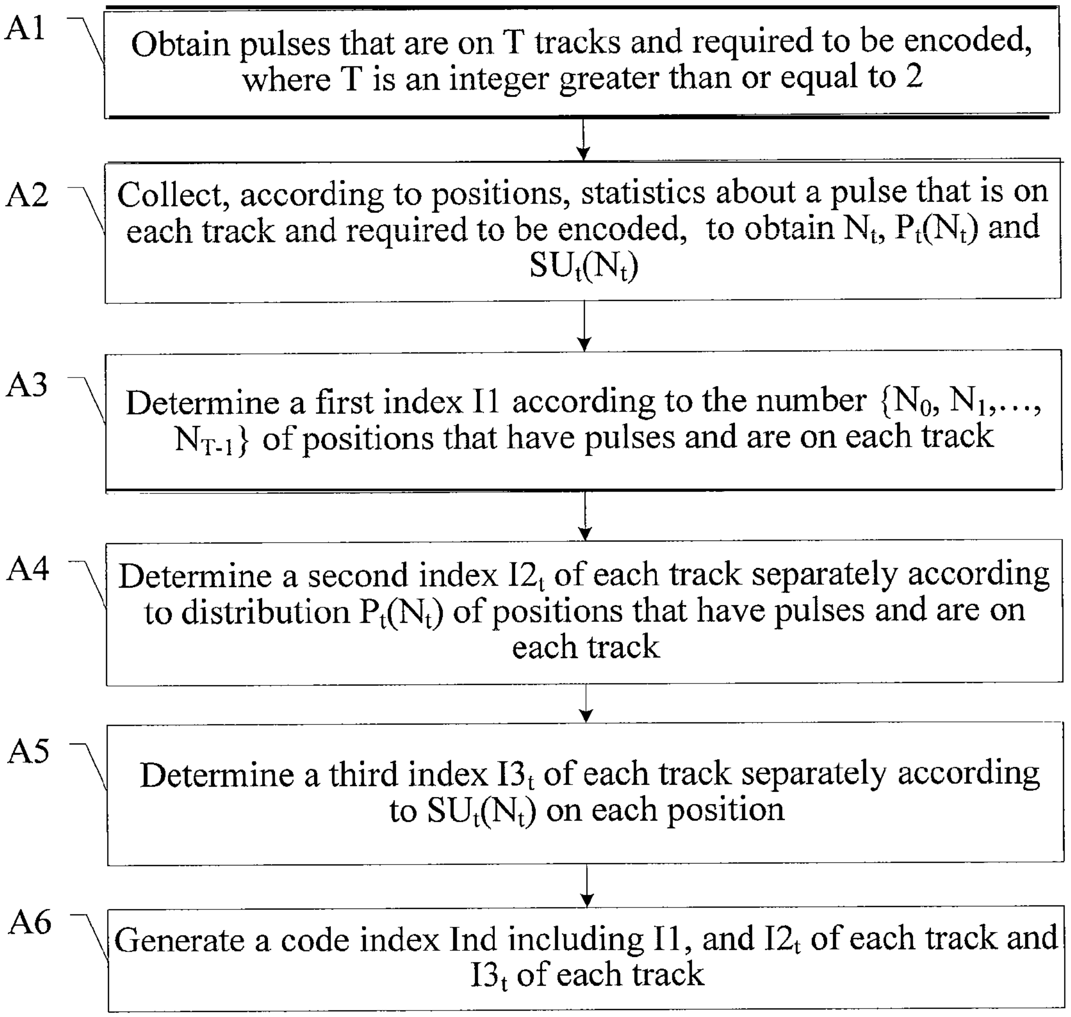
FIG. 1 is a schematic flow chart of an encoding method according to Embodiment 1 of the present invention.

An embodiment of the present invention provides a pulse encoding method, in which more than two tracks are jointly encoded to save code bits. Embodiments of the present invention further provide a corresponding pulse decoding method and a pulse codec. Descriptions are respectively provided below in detail.

In a speech encoder, information of positions and symbols (if involved) of all pulses on each track are obtained through codebook searching. The information needs to be transferred to a decoding end completely, so that the decoding end can uniquely recover the information of positions and symbols (if involved) of all the pulses. Meanwhile, in order to decrease a bit rate as much as possible, it is expected that bits as less as possible are used to transfer the information.

It may be known through theoretical analysis that, the number of permutations and combinations of positions and symbols (if involved) of all pulses on a same track is a minimum value of codebook space, and the corresponding number of code bits is a theoretical lower limit value. The total number of positions on a track and the total number of pulses on the track are specific. For situations in which the total number of positions on a track and the total number of pulses on the track have different values, the number of permutations and combinations of positions and symbols of all pulses is not always an integer power of 2, therefore the theoretical lower limit value of the number of code bits is not always an integer, and in this case, the actual number of code bits of single-track encoding is at least the integer part of the theoretical lower limit value plus 1, which inevitably causes part of the codebook space to be free. For example, Table 1 provides a theoretical lower limit value and an actual lower limit value of the number of code bits and situation of free space when the total number $\mathcal{N}$ of pulses required to be encoded is 1 to 6 on a track with the total number of positions being 16.

TABLE 1

| N | The Total Number of Permutations and Combinations | The Number of Required Bits (bit): Theoretical Lower Limit Value | The Number of Required Bits (bit): Actual Lower Limit Value of Single-track Encoding | The Number of Free Combinations | Proportion of the Free |
|---|---|---|---|---|---|
| 1 | 32 | 5 | 5 | 0 | 0 |
| 2 | 512 | 9 | 9 | 0 | 0 |
| 3 | 5472 | 12.4179 | 13 | 2720 | 33.2% |
| 4 | 44032 | 15.4263 | 16 | 21504 | 32.8% |
| 5 | 285088 | 18.1210 | 19 | 239200 | 45.6% |
| 6 | 1549824 | 20.5637 | 21 | 547328 | 26.1% |

It may be seen from Table 1 that, in most situations, the actual lower limit value may still incur great waste of the codebook space, therefore the present invention proposes that, joint encoding is performed on more than two tracks, and in this way, free codebook space in single-track encoding may be combined, and once combined free space is sufficient, 1 actual code bit may be reduced. Obviously, for tracks of a same type (both the total numbers of positions on the tracks and the total numbers of pulses on the tracks are the same), if only joint encoding is performed on K tracks, 1 code bit may be saved, K≥1/(1−kk), where kk is fractional part of a theoretical lower limit value of the single-track encoding. For example, for tracks with kk being smaller than 0.5, such as the tracks that are in Table 1 and with the total number of pulses being 3, 4, and 5, joint encoding of two together may save 1 code bit. For the tracks that are in Table 1 and with the total number of pulses being 6, joint encoding of three together may save 1 code bit. Definitely, joint encoding of tracks of different types may also achieve a same effect, and if only a sum of kks of 2 tracks is smaller than 1, or a sum of kks of 3 tracks is smaller than 2, 1 bit may be saved; obviously, if a sum of kks of 3 tracks is smaller than 1, 2 bits may be saved, and on the rest can be deduced by analogy. Table 2 provides a comparison between joint encoding of 2 tracks of a same type and single-track encoding (it is taken into account that a pulse has a symbol), where the total number of positions on the track is 16, and the total number $\mathcal{N}$ of pulses required to be encoded is 3 to 5.

TABLE 2

| N | The Number of Permutations and Combinations from Joining 2 Tracks | Actual Lower Limit Value of Encoding of 2 Single Tracks | Actual Lower Limit Value of Joint Encoding of 2 Tracks |
|---|---|---|---|
| 3 | 5472 × 5472 | 26 | 25 |
| 4 | 44032 × 44032 | 32 | 31 |
| 5 | 285088 × 285088 | 38 | 37 |

Table 3 provides a comparison between joint encoding of 2 to 3 tracks of different types and single-track encoding (it is taken into account that a pulse has a symbol), where the total number of positions on the track is 16, and the total number $\mathcal{N}$ of pulses required to be encoded is 3 to 5.

TABLE 3

| Joint mode | N | The Number of Permutations and Combinations of Single Tracks | Actual Lower Limit Value of Single-track Encoding | Actual Lower Limit Value of Joint Encoding of Tracks |
|---|---|---|---|---|
| Joining of 2 Tracks | 3 | 5472 | 13 | 28 |
| | 4 | 44032 | 16 | |
| Joining of 2 Tracks | 4 | 44032 | 16 | 34 |
| | 5 | 285088 | 19 | |
| Joining of 3 Tracks | 3 | 5472 | 13 | 47 |
| | 4 | 44032 | 16 | |
| | 5 | 285088 | 19 | |

The foregoing provides the theoretical analysis of saving the number of bits in joint encoding of multiple tracks. In order to achieve a theoretical effect, a code index is required to use codebook space as efficiently as possible. Encoding methods for achieving an actual bit lower limit value of joint encoding of multiple tracks are separately provided below through specific embodiments.

Embodiment 1: A pulse encoding method, as shown in FIG. 1, includes:

A1: Obtain pulses that are on T tracks and required to be encoded, where T is an integer greater than or equal to 2.

In the T tracks, the total number of pulses required to be encoded on each track is usually determined according to a bit rate. The more the number of pulses required to be encoded, obviously, the more the number of bits required by a code index, and the higher the bit rate. In the specification, $pulse\_num_t$ represents the total number of pulses that are on a $t^{th}$ track and required to be encoded. It is assumed that pulse- $\_num_t = \mathcal{N}_t$, $t\in[0, T-1]$. The total numbers of pulses on tracks of joint encoding may be the same, and may also be different.

A2: Separately collect, according to positions, statistics about a pulse that is on each track and required to be encoded, to obtain the number $N_t$ of positions that have pulses on each track, distribution of the positions that have pulses on the track, and the number of pulses on each position that has a pulse.

In the specification: $pos\_num_t$ represents the number of positions that have pulses and are on the $t^{th}$ track. Distribution of $\mathcal{N}_t$ pulses on the track may overlap in terms of position, and it is assumed that $pos\_num_t=N_t$, so that obviously $N_t\in[1, \mathcal{N}_t]$.

A pulse position vector $P_t(N_t)$ $\{p_t(0), p_t(1), \ldots, p_t(N_t-1)\}$ represents the distribution of the positions that have pulses and are on the $t^{th}$ track, where $p_t(n)$ represents a position serial number of a position that has a pulse on the $t^{th}$ track, $n\in[0, N_t-1]$, $p_t(n)\in[0, M_t-1]$, $M_t$ in the specification represents the total number of positions on the $t^{th}$ track, generally $M_t$ may be 8, 16 and so on, and the total numbers of positions on the tracks of joint encoding may be the same, and may also be different.

A pulse number vector $SU_t(N_t)=\{su_t(0), su_t(1), \ldots, su_t(N_t-1)\}$ represents the number of pulses on each position that has the pulse and is on the $t^{th}$ track, where $su_t(n)$ represents the number of pulses of a $p_t(n)$ position, and obviously $su_t(0)+su_t(1)+\ldots+su_t(N_t-1)=\mathcal{N}_t$.

Furthermore, a pulse required to be encoded may have a symbol, that is, have a feature of being positive or negative. In this case, when statistics is collected, according to the positions, about the pulses that are on the track and required to be encoded, it is further required that pulse symbol information of each position that has the pulse is obtained, and in the specification:

A pulse symbol vector $S_t(N_t)=\{s_t(\mathbf{0}), s_t(\mathbf{1}), \ldots, s_t(N_t-1)\}$ represents pulse symbol information of each position that has the pulse and is on the $t^{th}$ track, where $s_t(n)$ represents a pulse symbol of the $p_t(n)$ position and is called a symbol index of the $p_t(n)$ position. Based on that the pulse symbol represented by $s_t(n)$ has a binary nature of being positive or negative, generally the following simple encoding manner may be adopted: $s_t(n)=0$ is used to indicate a positive pulse, and $s_t(n)=1$ is used to indicate a negative pulse. Definitely, for pulses required to be encoded, a pulse symbol is not a necessary feature, and according to actual needs, a pulse may have only position and quantity features, and in this case, it is not required to collect statistics about the pulse symbol information.

Obviously, values in $P_t(N_t)$, $SU_t(N_t)$ and $S_t(N_t)$ have one-to-one correspondence.

After parameters $N_t$, $P_t(N_t)$, $SU_t(N_t)$, and $S_t(N_t)$ required for joint encoding of tracks are obtained by collecting statistics, it is required that the parameters are encoded into indexes, and correspondence between the parameters and the indexes is established, so that a decoding side can recover corresponding parameters according to the indexes. Two indicating manners may be adopted for the correspondence. One is that an algebraic manner is used to indicate a calculation relationship, and in this situation, an encoding side performs forward calculation on the parameters to obtain the indexes, and the decoding side performs reverse calculation on the indexes to obtain the parameters. The other one is that a mapping manner is used to indicate a query relationship, and in this situation, the encoding and decoding sides both need to store a mapping table associating the parameters with the indexes. Selection may be performed on the two kinds of correspondence according to specific features of the parameters. Generally speaking, in a situation with a large amount of data, designing correspondence indicated by the calculation relationship can save the amount of storage of the encoding and decoding sides, and is favorable. Encoding of each parameter is illustrated below respectively.

A3: According to the number $\{N_0, N_t, \ldots, N_{T-1}\}$ of positions that have pulses and are on each track, determine a first index I1, where the first index I1 corresponds to all possible distribution situations of positions that have pulses and are on each track under the number of the positions having pulses, where the number of the positions having pulses is represented by it.

The total number of possible situations of the $\{N_0, N_1, \ldots, N_{T-1}\}$ combination is $$\prod_{t=0}^{T-1} N_t.$$

A value of $N_1$ is not large, generally the total number T of tracks of joint encoding is also not very large, so that the total number of possible situations of the $\{N_0, N_1, \ldots, N_{T-1}\}$ combination is not very large, and therefore it is feasible that correspondence between the $\{N_0, N_1, \ldots, N_{T-1}\}$ combination and the first index I1 adopts the calculation relationship or the query relationship.

When the correspondence between the $\{N_0, N_1, \ldots, N_{T-1}\}$ combination and I1 is established, generally, a one-to-one relationship may be set between them and I1, that is, a first index corresponds to a $\{N_0, N_1, \ldots, N_{T-1}\}$ combination. The value $N_t$ of $pos\_num_t$ determines the total number $W_t(N_t)$ of all possible situations of $P_t(N_t)$, $W_t(N_t)=C_{M_t}^{N_t}$, and "C" indicates acquiring the number of combinations, so that an I1 corresponds to $$\prod_{t=0}^{T-1} W_t(N_t)$$

possible $P_t(N_t)$ combinations $\{P_0(N_0), P_1(N_1), \ldots, P_{T-1}(N_{T-1})\}$.

Definitely, if some $N_t$ values of a certain track correspond to a small number of situations of $P_t(N_t)$, the $N_t$ values may be combined to correspond to a same I1, that is, at least one I1 corresponds to more than two $\{N_0, N_1, \ldots, N_{T-1}\}$ combinations, and in this case, an extra additional index $If_t$ is required to distinguish the $\{N_0, N_1, \ldots, N_{T-1}\}$ combinations corresponding to the same I1, that is, the additional index $If_t$ is used to further determine a current $N_t$ value of a track with a non-one $N_t$ value corresponding to I1.

Different I1 may be regarded as a classification index of joint encoding of tracks, which divides codebook space of entire joint encoding into several parts according to combinations of the numbers of pulse positions of each track. Situations of combination classification of joint encoding are illustrated below through examples. Table 4 is a combination classification scheme of 3-pulse 2-track joint encoding. Totally there are 3×3 $N_t$ value combinations, and each combination corresponds to a classification (I1). It is assumed that the total numbers $M_t$ of positions on the tracks are all 16.

TABLE 4

| Classification | Track 0 $N_t$ | Track 1 $N_t$ | The Number of $P_t(N_t)$ combinations |
|---|---|---|---|
| 1 | 3 | 3 | 560 × 560 |
| 2 | 3 | 2 | 560 × 120 |
| 3 | 2 | 3 | 120 × 560 |
| 4 | 2 | 2 | 120 × 120 |
| 5 | 3 | 1 | 560 × 16 |
| 6 | 1 | 3 | 16 × 560 |
| 7 | 2 | 1 | 120 × 16 |
| 8 | 1 | 2 | 16 × 120 |
| 9 | 1 | 1 | 16 × 120 |

Table 5 is a combination classification scheme of 4-pulse 2-track joint encoding. Totally there are 4×4 $N_t$ value combinations, and similarly, each kind of combination corresponds to a classification (I1). It is assumed that the total numbers $M_t$ of positions on the tracks are all 16.

TABLE 5

| Classification | Track 0 $N_t$ | Track 1 $N_t$ | The Number of $P_t(N_t)$ combinations |
|---|---|---|---|
| 1 | 4 | 4 | 1820 × 1820 |
| 2 | 4 | 3 | 1820 × 560 |
| 3 | 3 | 4 | 560 × 1820 |
| 4 | 3 | 3 | 560 × 560 |
| 5 | 4 | 2 | 1820 × 120 |
| 6 | 2 | 4 | 120 × 1820 |
| 7 | 3 | 2 | 560 × 120 |
| 8 | 2 | 3 | 120 × 560 |
| 9 | 4 | 1 | 1820 × 16 |
| 10 | 1 | 4 | 16 × 1820 |
| 11 | 2 | 2 | 120 × 120 |
| 12 | 3 | 1 | 560 × 16 |
| 13 | 1 | 3 | 16 × 560 |
| 14 | 2 | 1 | 120 × 16 |
| 15 | 1 | 2 | 16 × 120 |
| 16 | 1 | 1 | 16 × 16 |

Table 6 is a combination classification scheme of 5-pulse 2-track joint encoding. What is different from the foregoing two examples is that, situations of $N_t$=1, 2, 3 are combined for classification. Totally there are 3×3 classifications (I1), and some classifications each correspond to multiple $N_t$ value combinations. It is assumed that the total numbers $M_t$ of positions on the tracks are all 16.

TABLE 6

| Classification | Track 0 $N_t$ | Track 1 $N_t$ | The Number of $P_t(N_t)$ combinations |
|---|---|---|---|
| 1 | 5 | 5 | 4368 × 4368 |
| 2 | 5 | 4 | 4368 × 1820 |
| 3 | 4 | 5 | 1820 × 4368 |
| 4 | 4 | 4 | 1820 × 1820 |
| 5 | 5 | 1, 2, 3 | 4368 × (16 + 120 + 560) |
| 6 | 1, 2, 3 | 5 | (16 + 120 + 560) × 4368 |
| 7 | 4 | 1, 2, 3 | 1820 × (16 + 120 + 560) |
| 8 | 1, 2, 3 | 4 | (16 + 120 + 560) × 1820 |
| 9 | 1, 2, 3 | 1, 2, 3 | (16 + 120 + 560) × (16 + 120 + 560) |

It may be seen from Table 6 that, $N_t$ values (generally $N_t$ values corresponding to the small numbers of position combinations) are combined together for classification, which may effectively reduce the total number of classifications of joint encoding (for example, the number of classifications is 9 in Table 6, which is far smaller than the number, 25, of classifications in a one-to-one corresponding situation). Definitely, accordingly, it is required that the extra additional index $If_t$ is used to determine a current $N_t$ value in a classification situation where non-one $N_t$ values exist. That is, space divided by I1 is further divided into subspace identified by the additional index $If_t$.

A4: Determine a second index I2$_t$ of each track separately according to distribution $P_t(N_t)$ of positions that have pulses and are on each track, where the second index I2$_t$ indicates, among all possible distribution situations corresponding to the first index I1, a distribution situation which corresponds to distribution of current positions having pulses on a corresponding track.

The total possible number of $P_t(N_t)$ is $W_t(N_t)\,C_{M_t}^{N_t}$, and the amount of data is large, therefore it is more suitable to adopt the calculation relationship for correspondence with the second index I2$_t$, and definitely it is also feasible to adopt the query relationship. Obviously, $W_t(N_t)$ is the number of all possible values of I2$_t$. If a value of I2$_t$ is counted starting from 0, I2$_t \in [0, W_t(N_t)-1]$.

Definitely, in a situation where the additional index $If_t$ needs to be used, the $N_t$ value determining a range of I2$_t$ is jointly determined by the first index I1 and the additional index $If_t$.

In order to determine the correspondence between $P_t(N_t)$ and I2$_t$ through algebraic calculation, a calculation formula of the second index I2$_t$ is provided below:

$$I2_t = C_{M_t}^{N_t} - C_{M_t-p_t(0)}^{N_t} + \sum_{n=1}^{N_t-1}\left[C_{M_t-p_t(n-1)-1}^{N_t-n} - C_{M_t-p_t(n)}^{N_t-n}\right];$$

where $p_t(n)$ represents a position serial number of an $n^{th}$ position that has a pulse on a track, $n \in [0, N_t-1]$, $p_t(0) \in [0, M_t-N_t]$, $p_t(n) \in [p_t(n-1)+1, M_t-N_t+n]$, $p_t(0)<p_t(1)< \ldots <p_t(N_t-1)$, or $p_t(0)>p_t(1)> \ldots >p_t(N_t-1)$.

By adopting the foregoing method, the second index I2$_t$ of each track can be obtained through the calculation relationship. Because the amount of data occupied by I2$_t$ in the code index is large, adopting the calculation method can reduce the amount of storage on both the encoding and decoding sides as much as possible. Meanwhile, because I2$_t$ is continuously encoded and strictly one-to-one corresponds to $P_t(N_t)$, code bits can be used to a maximum degree, thereby avoiding waste. For principles, specific deduction and descriptions of the calculation method, reference may be made to the China Patent Application (the publication date is Oct. 29, 2008) with the publication No. being CN101295506, and particularly reference may be made to page 13 line 18 to page 15 line 9 of the specification of the application file (Embodiment 2, drawings 14 and 15); and for a corresponding decoding calculation method, reference may be made to page 16 line 23 to page 17 line 12 of the specification of the application file (Embodiment 4).

A5: Determine a third index I3$_t$ of each track separately according to the number $SU_t(N_t)$ of pulses on each position that has the pulse and is on the track.

$SU_t(N_t)$ is a vector having the same number of dimensions as $P_t(N_t)$, but it is limited that $su_t(0)+su_t(1)+ \ldots +su_t(N_t-1)=\mathcal{N}_t$, and generally the value of $\mathcal{N}_t$ is not large, normally 1 to 6, therefore the total possible number of $SU_t(N_t)$ is not large, and it is feasible to adopt the calculation relationship or the query relationship for correspondence with the third index I3$_t$. It should be noted that, in some extreme situations, for example $N_t$=1 or $N_t=\mathcal{N}_t$, in this case $SU_t(N_t)$ only has one possible situation, no specific $I3_t$ is required for indication, and the $I3_t$ may be regarded as any value not affecting generation of a final code index.

Figure 2:
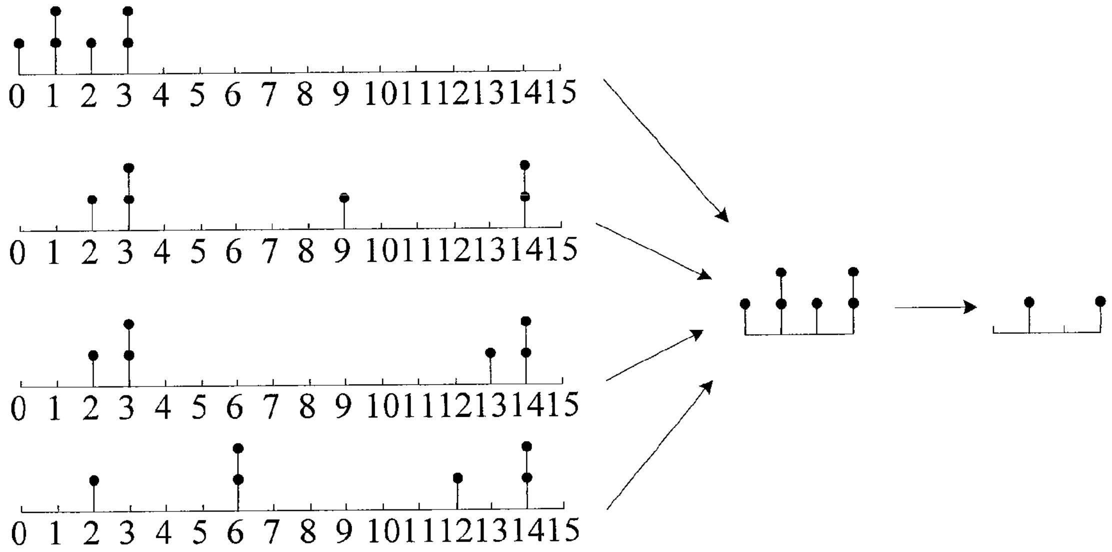
FIG. 2 is a schematic diagram of pulse position mapping according to Embodiment 1 of the present invention.

In order to determine correspondence between $SU_t(N_t)$ and $I3_t$ through algebraic calculation, a calculation method of the third index $I3_t$ is provided below:

For a $t^{th}$ track, situations that $N_t$ positions having pulses have $\mathcal{N}_t$ pulses are mapped to situations that $N_t$ positions have $\mathcal{N}_t - N_t$ pulses, where $\mathcal{N}_t$ represents the total number of pulses that are required to be encoded and on the $t^{th}$ track. For example, in the four kinds of 6-pulse 4-position ($\mathcal{N}_t=6$, $N_t=4$) situations shown in FIG. 2, $SU_t(N_t)$ is always {1, 2, 1, 2}, 1 is subtracted from the number of pulses in each position (because each position has at least one pulse) to obtain {0, 1, 0, 1}, that is, information of $SU_t(N_t)$ is mapped to a 2-pulse 4-position encoding situation.

According to set order, all possible distribution situations of $\mathcal{N}_t - N_t$ pulses on $N_t$ positions are arrayed, and an arrayed serial number is used as the third index $I3_t$ indicating the number of pulses on a position that has a pulse.

A calculation formula reflecting the foregoing calculation method is:

$$I3_t = C_{PPT}^{\Delta N_t} - C_{PPT-q(0)}^{\Delta N_t} + \sum_{h=1}^{\Delta N_t - 1} \left[ C_{PPT-h-q(h-1)}^{\Delta N_t - h} - C_{PPT-h-q(h)}^{\Delta N_t - h} \right];$$

Where $\Delta\mathcal{N}_t = \mathcal{N}_t - N_t$, $PPT = \mathcal{N}_t - 1$, q(h) represents a position serial number of an $(h+1)^{th}$ pulse, $h \in [0, \Delta\mathcal{N}_t - 1]$, $q(h) \in [0, N_t - 1]$, $q(0) \le q(1) \le \ldots \le q(\Delta\mathcal{N}_t - 1)$, or $q(0) \ge q(1) \ge \ldots \ge q(\Delta\mathcal{N}_t - 1)$, and Σ indicates summation.

For principles, specific deduction and descriptions of the calculation method, reference may be made to the China Patent Application (the publication date is Mar. 18, 2009) with the publication No. being CN101388210, and particularly reference may be made to page 8 line 23 to page 10 line 7 of the specification of the application file (Embodiment 2, drawing 6); and for a corresponding decoding calculation method, reference may be made to page 21 line 10 to page 21 line 27 of the specification of the application file (Embodiment 6).

A6: Generate a general code index Ind of T tracks, where the code index Ind includes information of the first index I1 and the second and third indexes $I2_t$ and $I3_t$ of each track.

I1, $I2_t$, $I3_t$, the additional index $If_t$ (if involved) and the symbol index $Is_t$ (if involved) may be placed in the code index in any manner that can be identified by the decoding side, and for example in a simplest manner, may be stored in fixed fields separately and separately. In consideration of a precondition that the total number $pulse\_num_t$ of pulses required to be encoded on each track is specific, the value $N_t$ of each $pos\_num_t$ indicated by I1 determines a variation range of $I2_t$ and $I3_t$, that is, determines the number of code bits required by $I2_t$ and $I3_t$ (if involved, also determines the number of code bits required by $Is_t$), therefore the following manners may be adopted to construct the code index.

① The first index I1 is used as a starting value, and information of other indexes are superposed. A value of I1 corresponds to an independent value range of the code index. In this way, the decoding side may directly determine a value combination $\{N_0, N_1, \ldots, N_{T-1}\}$ of $pos\_num_t$ according to the value range of the code index. Definitely, in a situation with the additional index, only an $N_t$ value combination of the track with a non-one $N_t$ value corresponding to the first index can be determined according to I1, for example, the combination "1, 2, 3" in Table 6. No matter an $N_t$ value or an $N_t$ value combination is determined, its required encoding space is determined, so that the value range determined by I1 (generally corresponds to a certain length of a field) may be further divided into T parts to be used by $I2_t$, $I3_t$, and $If_t$ (if involved) of T tracks separately.

② $I2_t$ and $I3_t$ may be placed in any manner that can be identified by the decoding side, and for example in a simplest manner, may be stored separately. Because $I2_t$ and $I3_t$ usually cannot be represented by an integer power of 2, in order to save code bits as much as possible, $I2_t$ and $I3_t$ of the $t^{th}$ track may be combined into the following form to be placed in a section allocated from the value range determined by I1:

$$Index(t) = I2_t + I3_t \times W_t(N_t) = I2_t + I3_t \times C_{M_t}^{N_t},$$

where $I2_t$ and $I3_t$ are both encoded starting from 0, $I2_t \in [0, W_t(N_t)-1]$, $I3_t \in [0, Class(N_t)-1]$, and $Class(N_t)$ is the total possible number of $SU_t(N_t)$. Obviously, the manner is equivalent to that the value range allocated from I1 is divided into $Class(N_t)$ sections with the length being $W_t(N_t)$, and each section corresponds to a distribution situation of $SU_t(N_t)$.

Definitely, in a situation where $If_t$ needs to be used, the value range allocated from I1 to the track needs to be first assigned by $If_t$ to different $N_t$ for use, and then $I2_t$ and $I3_t$ are placed in the space assigned to each $N_t$, and in this case, $$Index(t) = If_t + I2_t + I3_t \times C_{M_t}^{N_t}.$$

③ Definitely, in a situation where an encoded pulse is a pulse with a symbol, each Index(t) is further required to include information of a symbol index $s_t(n)$ of each pulse. For example, the symbol index $Is_t$ of the $t^{th}$ track may be used as a field with the length being $N_t$ to be placed in a fixed position, for example, the end, in the value range allocated from I1 to the track, and in this case, $Index(t) = (I2_t + I3_t \times C_{M_t}^{N_t}) \times 2^{N_t} + Is_t$ (for a track with a one $N_t$ value corresponding to the first index), or, $Index(t) = If_t + (I2_t + I3_t \times C_{M_t}^{N_t}) \times 2^{N_t} + Is_t$ (for a track with a non-one $N_t$ value corresponding to the first index), where $Is_t = s_t(0) \times 2^{N_t-1} + s_t(1) \times 2^{N_t-2} + \ldots + s_t(N_t-1)$.

In conclusion, a construction manner of the general code index Ind of the T tracks may be indicated as:

$$\begin{aligned} Ind &= I1 + \text{Index}(T-1) + I_{max}(T-1) \times \\ &\quad \{\ldots \times \{\text{Index}(2) + I_{max}(2) \times [\text{Index}(1) + I_{max}(1) \times \text{Index}(0)]\} \ldots \} = \\ &\quad I1 + \text{Index}(0) \times \prod_{t=1}^{T-1} I_{max}(t) + \text{Index}(1) \times \prod_{t=2}^{T-1} I_{max}(t) + \ldots + \text{Index}(T-1), \end{aligned}$$

where $I_{max}(t)$ represents an upper limit value of Index(t), and "π" represents multiplying. During decoding, a manner of taking a remainder of $I_{max}(t)$ may be adopted to separate Index(t) one by one. For example, (Ind-I1) is used to take a remainder of $I_{max}(T-1)$ to obtain Index(T−1), Index(T−1) is subtracted from (Ind-I1) to obtain a value, which is divided by $I_{max}(T-1)$, and then a remainder of $I_{max}(T-2)$ is further obtained to obtain Index(T−2), and the rest can be deduced by analogy until Index(0) is obtained.

It should be easily understood that, the foregoing exemplified code index construction manner is only an alternative manner of this embodiment, and persons skilled in the art may use basic information forming the code index to easily obtain a construction manner of another code index structure. For example, index positions are swapped or recombined. Specifically, $I2_t$ of different tracks may be combined first, and then $I3_t$ and $Is_t$ are combined. The specific construction manner of the code index does not limit the embodiment of the present invention.

Figure 3:
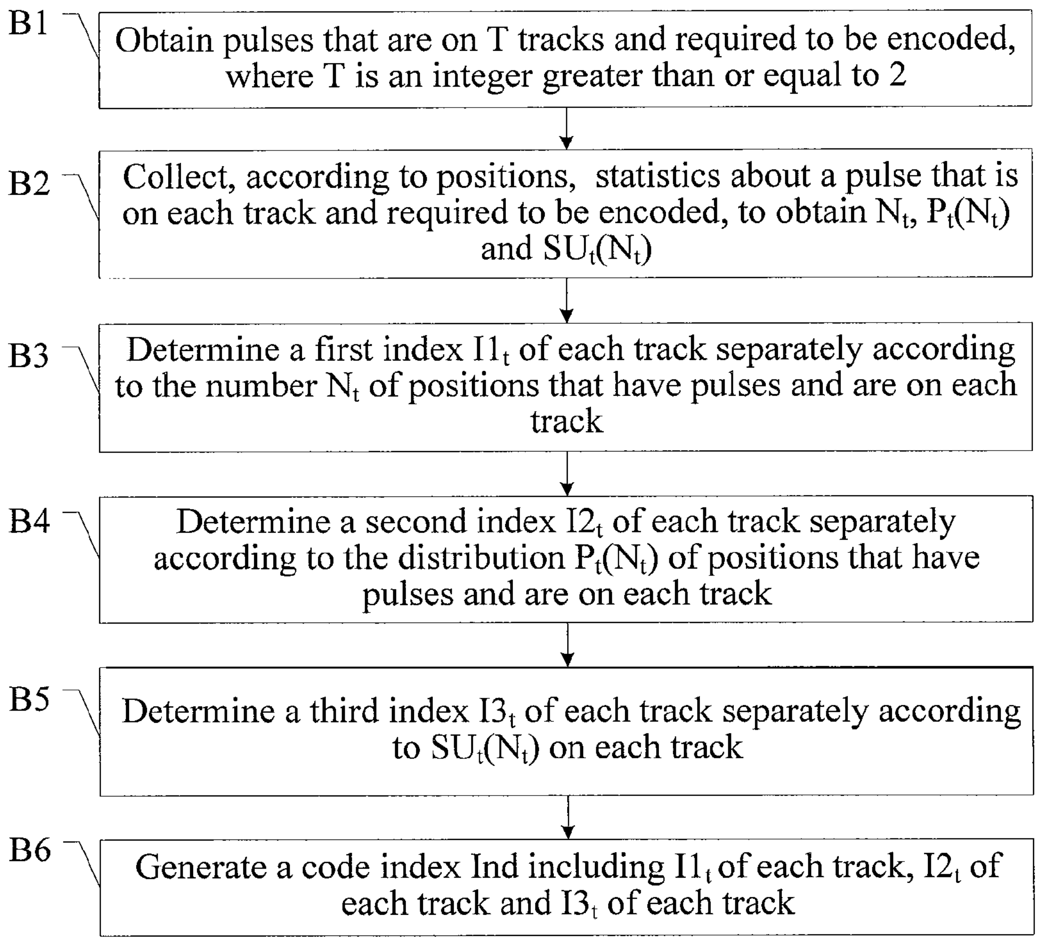
FIG. 3 is a schematic flow chart of an encoding method according to Embodiment 2 of the present invention.

Embodiment 2: A pulse encoding method, where in this embodiment, an index of each track of joint encoding is calculated separately, and combined to form a code index, as shown in FIG. 3, includes the following steps:

B1: Obtain pulses that are on T tracks and required to be encoded, where T is an integer greater than or equal to 2.

B2: Separately collect, according to positions, statistics about a pulse that is on each track and required to be encoded, to obtain the number $N_t$ of positions that have pulses on each track, distribution of the positions that have pulses on the track, and the number of pulses on each position that has a pulse.

Steps B1 and B2 may be executed with reference to steps A1 and A2 in Embodiment 1.

B3: According to the number of positions that have pulses and are on each track, determine a first index $I1_t$ of each track separately, where the first index $I1_t$ corresponds to all possible distribution situations of positions that have pulses and are on the track under the number of the positions having pulses, where the number of the positions having pulses is represented by the first index $I1_t$.

B4: Determine a second index $I2_t$ of each track separately according to the distribution of positions that have pulses and are on each track, where the second index $I2_t$ indicates, among all possible distribution situations corresponding to the first index $I1_t$, a distribution situation which corresponds to distribution of current positions having pulses and is on the track.

B5: Determine a third index $I3_t$ of each track separately according to the number of pulses on each position that has a pulse and is on each track.

Steps B3 to B5 may be executed with reference to steps A1 and A2 in Embodiment 1. For details of the process of obtaining the index of each track separately, reference may be made to the China Patent Application (the publication date is Oct. 29, 2008) with the publication No. being CN101295506, and particularly reference may be made to page 6 line 13 to page 15 line 9 of the specification of the application file (Embodiment 1 and Embodiment 2); and for a corresponding decoding calculation method, reference may be made to page 15 line 11 to page 17 line 12 of the specification of the application file (Embodiment 3 and Embodiment 4).

A6: Generate a general code index Ind of T tracks, where the code index Ind includes information of the first, second, and third indexes $I1_t$, $I2_t$ and $I3_t$ of each track.

$I1_t$, $I2_t$, $I3_t$, and a symbol index $Is_t$ (if involved) may be placed in the code index in any manner that can be identified by a decoding side, and for example in a simplest manner, may be stored in fixed fields separately. Definitely, combination may also be performed. For example, indexes of tracks are combined together separately and then superposed. That is, the following manner is adopted to construct the code index:

$$Ind = \mathrm{Index}(0)\times\prod_{t=1}^{T-1} I_{max}(t) + \mathrm{Index}(1)\times\prod_{t=2}^{T-1} I_{max}(t) + \ldots + \mathrm{Index}(T-1),$$

where $I_{max}(t)$ represents an upper limit value of Index(t), $\mathrm{Index}(t)=I1_t+I2_t+I3_t\times C_{M_t}^{N_t}$ (a situation where a pulse symbol is not taken into account), or, $\mathrm{Index}(t)=I1_t+(I2_t+I3_t\times C_{M_t}^{N_t})\times 2^{N_t}+Is_t$ (a situation where a pulse symbol is taken into account).

It is easily understood that, the foregoing exemplified code index construction manner is only an alternative manner of this embodiment, and persons skilled in the art may use basic information forming the code index to easily obtain a construction manner of another code index structure. For example, index positions are swapped or recombined in each track. The specific construction manner of the code index does not limit the embodiment of the present invention.

Embodiment 3: a pulse encoding method. This embodiment is a method proposed on the basis of Embodiment 1 or Embodiment 2 to further save code bits.

Figure 4:
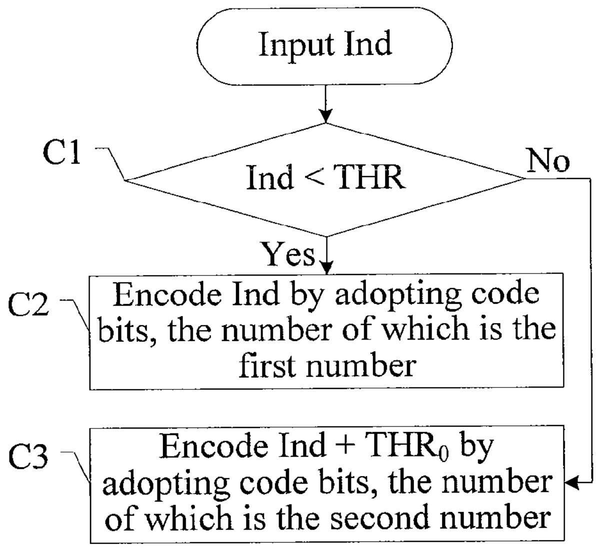
FIG. 4 is a schematic flow chart of an encoding method according to Embodiment 3 of the present invention.

A generation process of a code index Ind in the pulse encoding method in this embodiment may be executed with reference to the method in Embodiment 1 or Embodiment 2. After the code index Ind is generated, the following operations are executed, as shown in FIG. 4, and include:

C1: Compare the code index Ind with an adjustment threshold THR, where $$THR \le 2^{Bmax} - I_{max}(T),$$

$I_{max}(T)$ represents an upper limit value of Ind, Bmax represents an upper limit value of the number of bits used for encoding the code index; if Ind is smaller than THR, the procedure proceeds to step C2, otherwise the procedure proceeds to step C3.

C2: Encode Ind by using code bits, the number of which is the first number.

C3: Encode Ind plus an offset value $THR_0$ by using code bits, the number of which is the second number, where $THR \le THR_0 \le 2^{Bmax}-I_{max}(T)$, the so called first number is smaller than the second number, the second number is smaller than or equal to Bmax, and the first number and the second number are both positive integers.

For example, for a situation of joint encoding of two 4-pulse tracks (it is assumed that the total number of positions of each track is 16), the total possible number of Ind is $I_{max}(T)=44032\times 44032$ (it is taken into account that a pulse has a symbol), 31 code bits are required, its free codebook space is $2^{31}-44032\times 44032=208666624$, it may be set that $THR=THR_0=208666624$; when Ind is smaller than 208666624, code bits, the number of which is the first number (30), are used to encode Ind; when Ind is greater than 208666624, code bits, the number of which is the second number (31), are used to encode Ind+208666624. Obviously, there is a probability of 9.7% of further saving a bit on the basis of the 31 bits. Definitely, the adjustment threshold THR may be set to be smaller than 208666624, so as to save more bits, but accordingly, a probability of occurrence of a situation where a bit may be saved decreases dramatically, so that it needs balance consideration.

For principles, specific deduction and descriptions of the method for saving bits, reference may be made to the China Patent Application (the application date is Jun. 19, 2009) with the application No. being CN200910150637.8.

Furthermore, in order to increase the probability of occurrence of the situation where the bit may be saved, the following preferred manner may be adopted to set correspondence between a first index I1 and a $\{N_0, N_1, \ldots, N_{T-1}\}$ combination that are in the code index Ind. Collect statistics about a probability of occurrence of the $\{N_0, N_1, \ldots, N_{T-1}\}$ combination, to make a first index corresponding to a combination with a higher probability of occurrence be smaller, so as to decrease an encoded index value of the combination with the high probability of occurrence as much as possible.

Embodiment 4: a pulse encoding method. This embodiment proposes a new method for joint encoding of tracks from a perspective different from Embodiment 1 and Embodiment 2.

Figure 5:
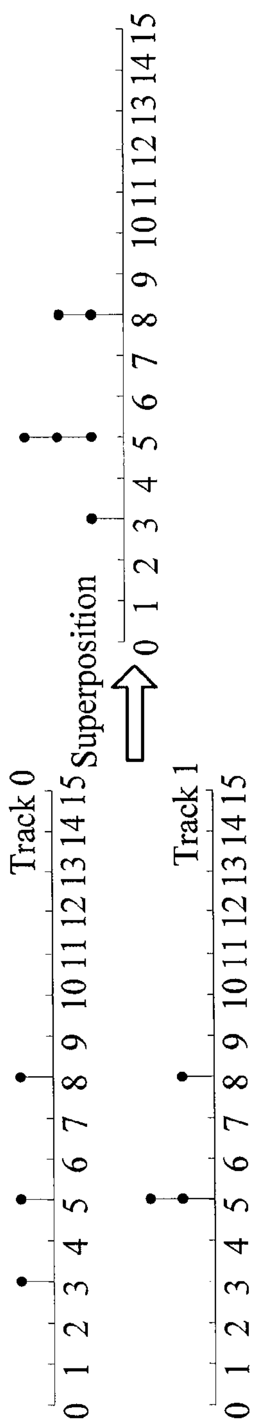
FIG. 5 is a schematic diagram of track pulse superposition according to Embodiment 4 of the present invention.

In Embodiment 1 and Embodiment 2, no matter joint classification is performed on situations of positions that have pulses and are on the tracks (Embodiment 1) or the first index is set for each track (Embodiment 2), processing needs to be performed separately on pulse position distribution of each track. In this embodiment, a new idea is adopted, that is, tracks of joint encoding are overlapped to form 1 track, and pulse distribution information is superposed. For example, as shown in FIG. 5, 2 3-pulse tracks are superposed to form 1 6-pulse track (it is assumed that the number of positions of each track is 16), and then, ① According to a distribution situation of pulses of a single track, a distribution index of a superposed track is calculated. For example, the combination manner of $I1_t$, $I2_t$, $I3_t$, and $Is_t$ described in Embodiment 2 may be adopted.

Figure 6:
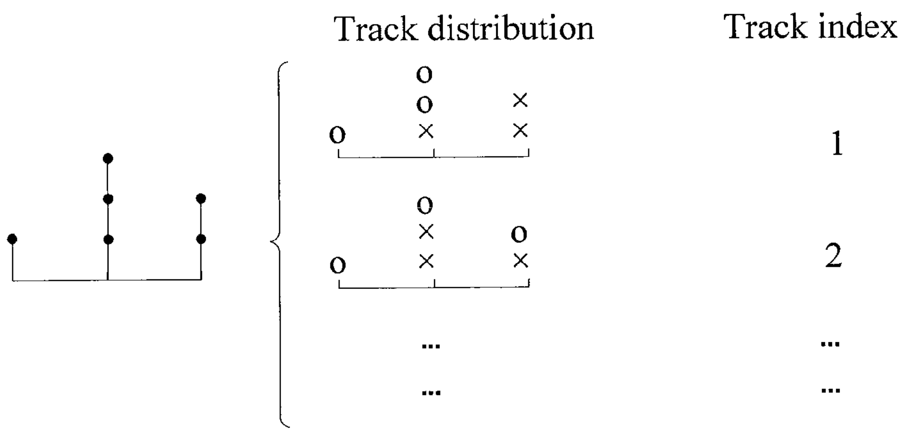
FIG. 6 is a schematic diagram of indexes of pulse distribution tracks according to Embodiment 4 of the present invention.

② A track index is established according to a situation of a track to which a pulse belongs. For example, as shown in FIG. 6, the 3-position 6-pulse obtained by superposition in FIG. 5 corresponds to different track distribution situations, and different track indexes may be used to indicate corresponding situations separately. In FIG. 6, "0" represents a pulse on a track 0, and "x" represents a pulse on a track 1.

③ The distribution index which is of a single track and obtained by superposing the pulses and the track index indicating the track to which the pulse belongs are combined together to obtain a final code index.

The joint encoding method in this embodiment may also save code bits as Embodiment 1 and Embodiment 2, and furthermore, may also be used in combination with Embodiment 3 to achieve the objective of further saving code bits.

Figure 7:
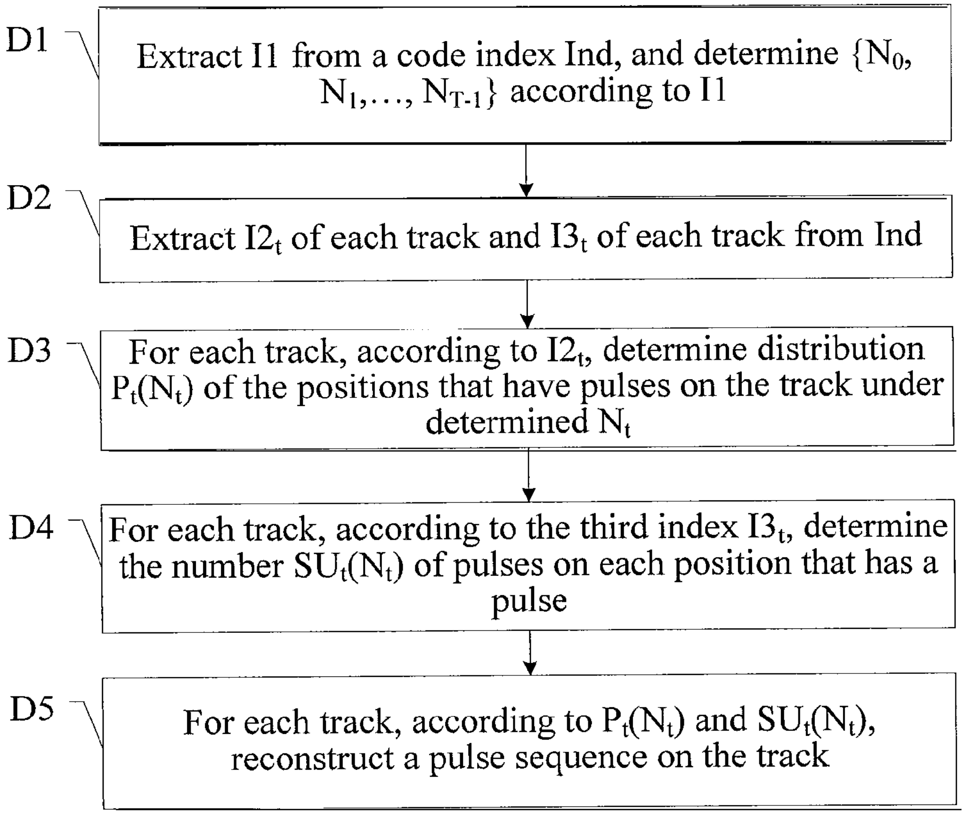
FIG. 7 is a schematic flow chart of a decoding method according to Embodiment 5 of the present invention.

Embodiment 5: A pulse decoding method, where the decoding method provided in this embodiment decodes a code index obtained according to the encoding method in Embodiment 1, and a decoding process is a reverse process of an encoding process, as shown in FIG. 7, includes:

D1: Obtain a code index Ind, extract a first index I1 from the code index Ind, and determine, according to the first index I1, the number $\{N_0, N_1, \ldots, N_{T-1}\}$ of positions that have pulses and are on each track of T tracks.

Extracting information of each index from Ind may be performed according to a reverse process of combining indexes into Ind during encoding. For example, if each index is stored in a fixed field separately, each index may be directly extracted.

If Ind adopts the structure provided in Embodiment 1 in which I1 is used as the starting value to superpose other indexes, I1 may be extracted first, and Index(t) of each track is separated from Ind according to a $\{N_0, N_1, \ldots, N_{T-1}\}$ combination corresponding to I1. In this case, an I1 corresponds to an independent value range of Ind, therefore a decoding side may judge a value range to which Ind belongs among several set independent value ranges, and determine the first index I1 according to a starting value corresponding to the value range to which Ind belongs.

Definitely, in a situation where a track with a non-one $N_1$ value corresponding to the first index I1 exists, for the track, I1 determines its $N_t$ value combination, an actual $N_t$ value is determined by a further-extracted additional index $If_t$, and in this case, the separated Index(t) includes information of $If_t$.

D2: Extract a second index $I2_t$ of each track and a third index $I3_t$ of each track from the code index Ind.

Similar to I1, extraction of $I2_t$ and $I3_t$ is also performed according to a reverse process of combination into Index($\mathcal{N}$), and for independent placement, extraction may be performed directly. If a encoding manner in which superposition is performed after combination, where the encoding manner is in Embodiment 1, is adopted for $I2_t$ and $I3_t$, in this step, $I2_t$, $I3_t$, $If_t$ (if involved) and $Is_t$ (if involved) are separated from Index(t), and a reverse operation may be performed according to the combination process.

For example, in a situation where $If_t$ and $Is_t$ are not involved, $I2_t$=Index(t) % $W_t$(N), and $I3_t$=Int[Index(t)/$W_t$($N_t$)], where % represents taking of a remainder, and Int represents rounding. In a situation where $If_1$ is involved, similar to determining I1, the additional index $If_t$ may be determined according to a starting value corresponding to a value range to which Index(t) belongs, and after $If_t$ is separated, $I2_t$, $I3_t$, and $Is_t$ (if involved) are further extracted according to the determined $N_t$ value.

D3: For each track, according to the second index $I2_t$, determine distribution of the positions that have pulses on the track under the number of positions having pulses, where the number of positions having pulses corresponds to the first index I1 and $If_t$ (if involved).

A reverse process of encoding $I2_t$ is adopted for decoding $I2_t$. If during encoding, $I2_t$ is obtained by adopting a calculation relationship, a reverse operation is performed by using the same calculation relationship during decoding. If during encoding, $I2_t$ is obtained by using a query relationship, the same correspondence is queried during decoding.

D4: For each track, according to the third index $I3_t$, determine the number of pulses on each position that has a pulse.

D5: For each track, according to distribution $P_t(N_t)$ of the positions that have pulses on the track and the number $SU_t(N_t)$ of pulses on each position that has the pulse, reconstruct a pulse sequence on the track.

For a situation where a pulse has a symbol, when a pulse sequence on each track is reconstructed, a positive or negative feature of a pulse symbol of each position that has a pulse is recovered according to pulse symbol information carried in each symbol index $s_t$(n).

Figure 8:
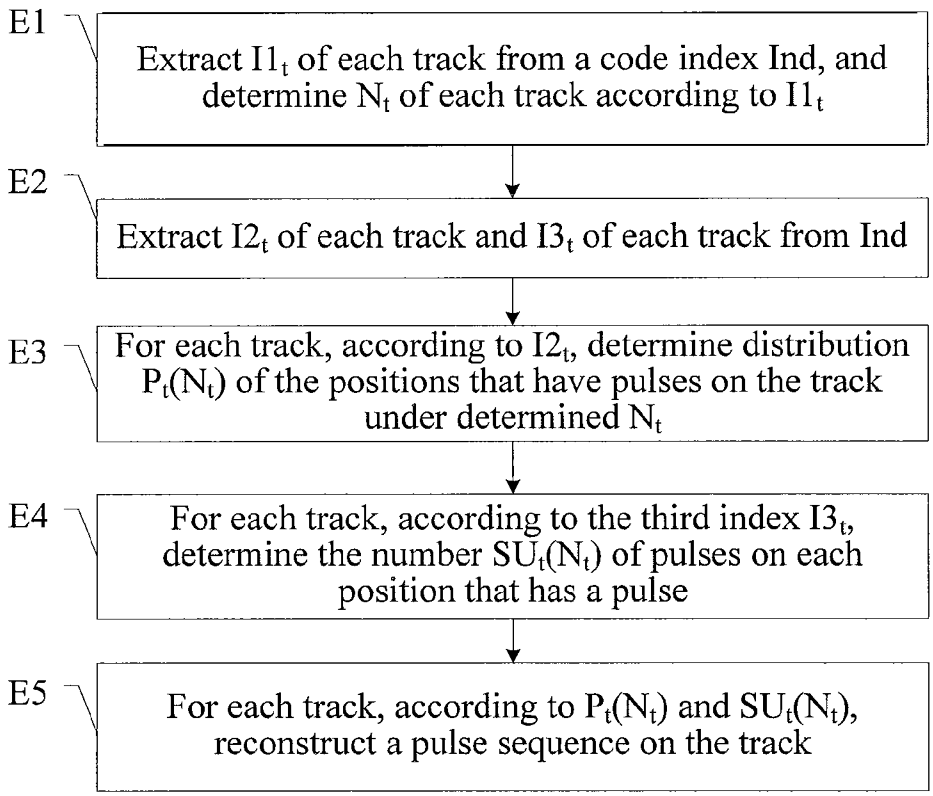
FIG. 8 is a schematic flow chart of a decoding method according to Embodiment 6 of the present invention.

Embodiment 6: A pulse decoding method, where the decoding method provided in this embodiment decodes a code index obtained according to the encoding method in Embodiment 2, and a decoding process is a reverse process of an encoding process, as shown in FIG. 8, includes:

E1: Obtain a code index Ind, extract a first index $I1_t$ of each track from the code index Ind, and determine, according to the first index $I1_t$, the number $N_t$ of positions having pulses for each track.

In a situation where the total number $\mathcal{N}_t$ of pulses on each track is determined (under different bit rates, the total number of bits of the code index is different, therefore a decoding side may determine the total number $\mathcal{N}_t$ of pulses on each track directly according to the length (the number of bits) of the code index), an upper limit value $I_{max}$(t) of Index(t) is determined, therefore Index(t) of each track may be directly separated from Ind, and $I1_t$ and corresponding $N_t$ are determined according to a value range of Index(t).

E2: Extract a second index $I2_t$ of each track and a third index $I3_t$ of each track from the code index Ind. That is, $I2_t$ and $I3_t$ are separated from Index(t), which may be executed with reference to step D2 in Embodiment 5. If a pulse symbol is involved, $Is_t$ may be further separated.

E3: For each track, according to the second index $I2_t$, determine distribution of the positions that have pulses on the track under the number of positions having pulses, where the number of positions having pulses corresponds to the first index $I1_t$.

E4: For each track, according to the third index $I3_t$, determine the number of pulses on each position that has a pulse.

E5: For each track, according to distribution $P_t(N_t)$ of the positions that have pulses on the track and the number $SU_t(N_t)$ of pulses on each position that has the pulse, reconstruct a pulse sequence on the track.

Steps E3 to E5 may be executed with reference to steps D3 to D5 in Embodiment 5.

Figure 9:
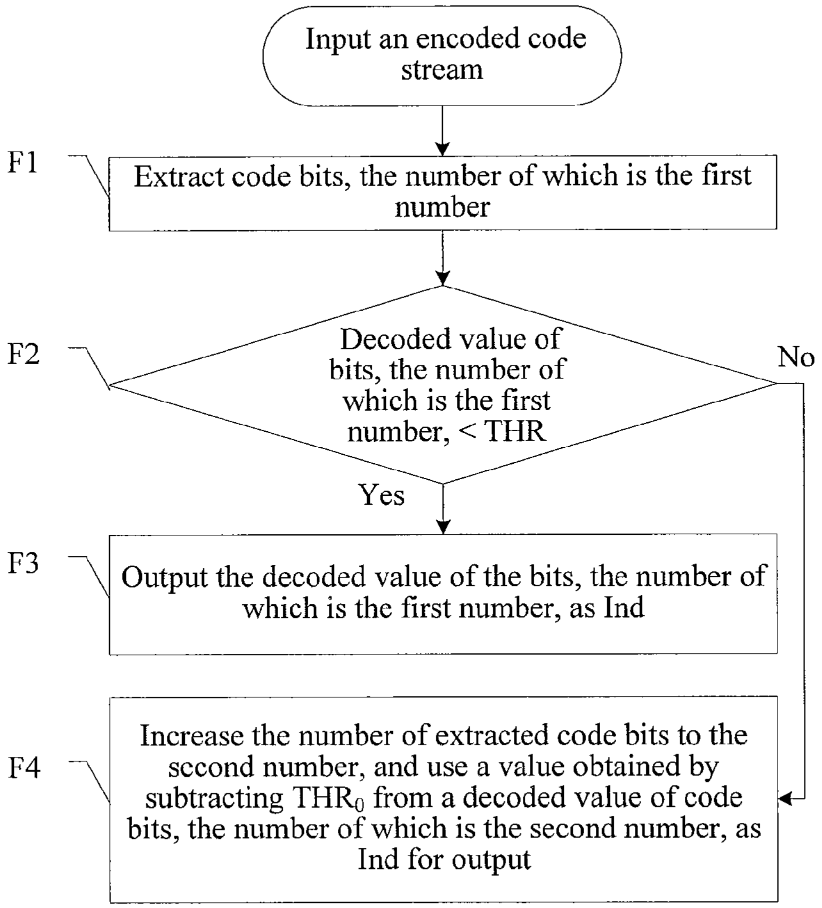
FIG. 9 is a schematic flow chart of a decoding method according to Embodiment 7 of the present invention.

Embodiment 7: A pulse decoding method, where the decoding method provided in this embodiment corresponds to the encoding method in Embodiment 3, and decodes a code stream of length-variable encoding in Embodiment 3 to obtain a code index, and a process is as shown in FIG. 9, includes:

F1: Extract code bits, the number of which is the first number, from an encoded code stream.

F2: If a decoded value of the code bits, the number of which is the first number, is smaller than an adjustment threshold THR, proceed to step F3, otherwise proceed to step F4.

F3: Use the decoded value of the code bits, the number of which is the first number, as a code index Ind.

F4: Otherwise, increase the number of extracted code bits to the second number, and use a value obtained by subtracting an offset value $THR_0$ from a decoded value of code bits, the number of which is the second number, as a code index Ind.

According to the decoding method in this embodiment, after the code index Ind is obtained from the encoded code stream, the code index Ind may be further decoded according to the decoding method in Embodiment 5 or Embodiment 6.

Figure 10:
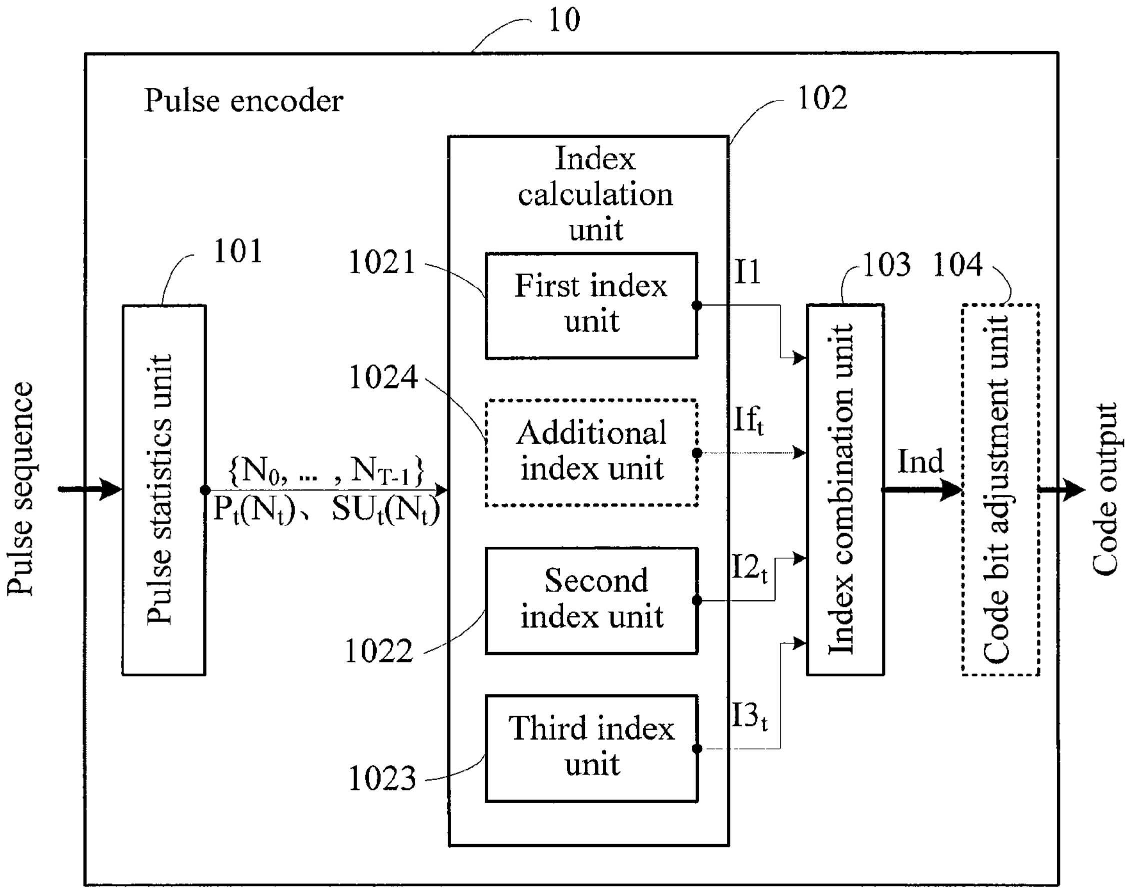
FIG. 10 is a schematic diagram of a logical structure of an encoder according to Embodiment 8 of the present invention.

Embodiment 8: A pulse encoder 10, where the encoder provided in this embodiment may be used to execute the encoding method in Embodiment 1, as shown in FIG. 10, includes:

A pulse statistics unit 101 is configured to obtain pulses that are on T tracks and required to be encoded, where T is an integer greater than or equal to 2; and separately collect, according to positions, statistics about a pulse that is on each track and required to be encoded, to obtain the number $N_t$ of positions that have pulses on each track, distribution of the positions that have pulses on the track, and the number of pulses on each position that has a pulse, where the subscript t represents a $t^{th}$ track, and $t \in [0, T-1]$.

An index calculation unit 102 includes:

A first index unit 1021 is configured to, according to the number $\{N_0, N_1, \ldots, N_{T-1}\}$ of positions that have pulses and are on each track, output a first index I1, where I1 corresponds to all possible distribution situations of positions that have pulses and are on each track under the number of the positions having pulses, where the number of the positions having pulses is represented by it.

A second index unit 1022 is configured to output a second index $I2_t$ of each track separately according to distribution of positions that have pulses and are on each track, where $I2_t$ indicates, among all possible distribution situations corresponding to I1, a distribution situation which corresponds to distribution of current positions having pulses on a corresponding track.

A third index unit 1023 is configured to output a third index $I3_t$ of each track separately according to the number of pulses on each position that has the pulse and is on each track.

An index combination unit 103 is configured to combine information of the first index I1 and the second and third indexes $I2_t$ and $I3_t$ of each track to form a code index Ind.

In a situation where at least one first index corresponds to more than two $\{N_0, N_1, \ldots, N_{T-1}\}$ combinations, the index calculation unit 102 may further include an additional index unit 1024 (indicated by a block with dotted edges in FIG. 10), configured to, for a track with a non-one $N_t$ value corresponding to the first index, determine an additional index $If_t$ corresponding to the number of current positions that have pulses and are on the track, where the additional index $If_t$ corresponds to all possible distribution situations of positions that have pulses and are on the track under the number of positions having pulses, where the number of positions having pulses is represented by it. In this case, the index combination unit 103 further combines information of the additional index $If_t$ into the code index Ind.

Furthermore, in a situation where length-variable encoding is performed on the code index by adopting the method in Embodiment 3, the pulse encoder 10 in this embodiment may further include a code bit adjustment unit 104 (indicated by a block with dotted edges in FIG. 10), configured to compare the code index Ind with an adjustment threshold THR after the index combination unit 103 generates the code index, where, $$THR \le 2^{Bmax} - I_{max}(T),$$

$I_{max}(T)$ represents an upper limit value of Ind, and Bmax represents an upper limit value of the number of bits used for encoding the code index; and if Ind is smaller than THR, code bits, the number of which is the first number, are used to encode Ind; otherwise, code bits, the number of which is the second number, are used to encode Ind plus an offset value $THR_0$, where $THR \le THR_0 \le 2^{Bmax} - I_{max}(T)$, the used first number is smaller than the second number, the second number is smaller than or equal to Bmax, and the first number and the second number are both positive integers.

Figure 11:
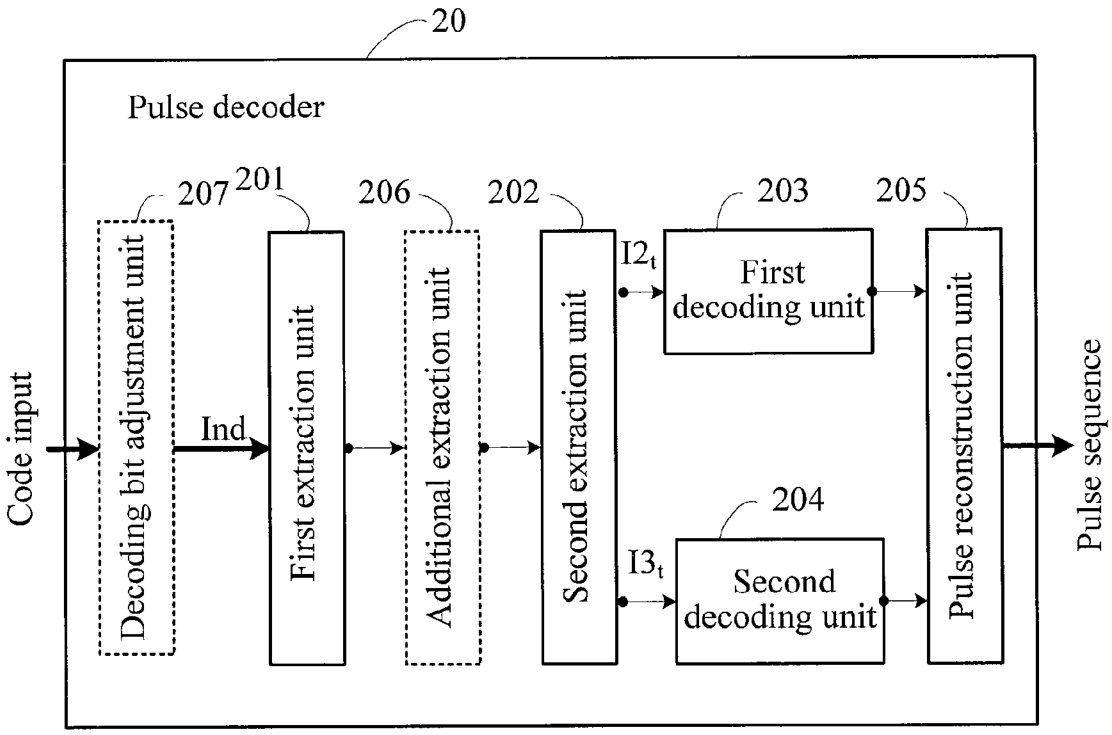
FIG. 11 is a schematic diagram of a logical structure of a decoder according to Embodiment 9 of the present invention.

Embodiment 9: A pulse decoder 20, where the decoder provided in this embodiment may be used to execute the decoding method in Embodiment 5, as shown in FIG. 11, includes:

A first extraction unit 201 is configured to obtain a code index Ind, extract a first index I1 from the code index Ind, and determine, according to the first index, the number $\{N_0, N_1, \ldots, N_{T-1}\}$ of positions that have pulses and are on each track of T tracks.

A second extraction unit 202 is configured to extract a second index $I2_t$ of each track and a third index $I3_t$ of each track from the code index Ind.

A first decoding unit 203 is configured to, for each track, according to the second index $I2_t$, determine distribution of the positions that have pulses on the track under the number of positions having pulses, where the number of positions having pulses corresponds to the first index.

A second decoding unit 204 is configured to, for each track, according to the third index $I3_t$, determine the number of pulses on each position that has a pulse.

A pulse reconstruction unit 205 is configured to, for each track, according to distribution of the positions that have pulses on the track and the number of pulses on each position that has the pulse, reconstruct a pulse sequence on the track.

In a situation where at least one first index corresponds to more than two $\{N_0, N_1, \ldots, N_{T-1}\}$ combinations, the decode in this embodiment may further include:

An additional extraction unit 206 (indicated by a block with dotted edges in FIG. 11) is configured to, for a track with a non-one $N_t$ value corresponding to the first index, extract an additional index $If_t$ corresponding to the number of current positions that have pulses and are on the track, where the additional index $If_t$ corresponds to all possible distribution situations of positions that have pulses and are on the track under the number of positions having pulses, where the number of positions having pulses is represented by it. In this case, the second extraction unit 202 extracts the second index $I2_t$ of the track and the third index $I3_t$ of the track according to the number of current positions that have pulses and are on a corresponding track, where the number of current positions that have pulses and are on a corresponding track is determined by the additional index If extracted by the additional extraction unit 206.

Furthermore, in a situation where decoding is performed on a code stream of length-variable encoding by adopting the method in Embodiment 7, the pulse decoder 20 in this embodiment may further include a decoding bit adjustment unit 207 (indicated by a block with dotted edges in FIG. 11), configured to extract code bits, the number of which is the first number, from an encoded code stream; if a decoded value of the code bits, the number of which is the first number, is smaller than an adjustment threshold THR, use the decoded value of the code bits, the number of which is the first number, as a code index Ind for output; otherwise, increase the number of extracted code bits to the second number, and use a value obtained by subtracting an offset value $THR_0$ from a decoded value of code bits, the number of which is the second number, as a code index Ind for output.

Persons of ordinary skill in the art may understand that, all or part of the steps in the method of the foregoing embodiments may be implemented through a program instructing relevant hardware. The program may be stored in a computer readable storage medium, and the storage medium may include a read only memory, a random access memory, a magnetic disk or an optical disk, and so on.

The pulse encoding and decoding methods and the pulse codec according to the embodiments of the present invention are described in detail above. The principles and implementation manners of the present invention are described here through specific embodiments. The description about the foregoing embodiments is merely provided for ease of understanding of the method and its core ideas of the present invention. Meanwhile, persons of ordinary skill in the art may make variations to the specific implementation manners and application scopes according to the ideas of the present invention. Therefore, the specification shall not be construed as a limit to the present invention.

What is claimed is:

1. A pulse encoding method performed by a pulse encoder implemented by hardware, comprising:

obtaining pulses that are on T tracks and required to be encoded, wherein T is an integer greater than or equal to 2;

separately collecting, according to positions, statistics about a pulse that is on each track and required to be encoded, to obtain the number $N_t$ of positions that have pulses on each track, distribution of the positions that have pulses on the track, and the number of pulses on each position that has a pulse, wherein the subscript t represents a $t^{th}$ track, and $t \in [0, T-1]$;

according to the number $\{N_0, N_1, \ldots, N_{T-1}\}$ of positions that have pulses and are on each track, determining a first index I1, wherein the first index I1 corresponds to all possible distribution situations of positions that have pulses and are on each track under the number of the positions having pulses, wherein the number of the positions having pulses is represented by it;

determining a second index $I2_t$ of each track separately according to distribution of positions that have pulses and are on each track, wherein the second index indicates, among all possible distribution situations corresponding to the first index I1, a distribution situation which corresponds to distribution of current positions having pulses on a corresponding track;

determining a third index $I3_t$ of each track separately according to the number of pulses on each position that has the pulse and is on each track; and generating a code index Ind, wherein the code index comprises information of the first index and the second and third indexes of each track; wherein:

one first index corresponds to one $\{N_0, N_1, \ldots, N_{T-1}\}$ combination, or, at least one first index corresponds to more than two $\{N_0, N_1, \ldots, N_{T-1}\}$ combinations; for a track with a non-one $N_t$ value corresponding to the first index, besides determining second and third indexes of the track, an additional index corresponding to the number of current positions that have pulses and are on the track is further determined, the additional index corresponds to all possible distribution situations of positions that have pulses and are on the track under the number of positions having pulses, wherein the number of positions having pulses is represented by it, and the code index further comprises information of the additional index.

2. A pulse encoding method performed by a pulse encoder implemented by hardware, comprising:

obtaining pulses that are on T tracks and required to be encoded, wherein T is an integer greater than or equal to 2;

separately collecting, according to positions, statistics about a pulse that is on each track and required to be encoded, to obtain the number $N_t$ of positions that have pulses on each track, distribution of the positions that have pulses on the track, and the number of pulses on each position that has a pulse, wherein the subscript t represents a $t^{th}$ track, and $t \in [0, T-1]$;

according to the number $\{N_0, N_1, \ldots, N_{T-1}\}$ of positions that have pulses and are on each track, determining a first index I1, wherein the first index I1 corresponds to all possible distribution situations of positions that have pulses and are on each track under the number of the positions having pulses, wherein the number of the positions having pulses is represented by it;

determining a second index $I2_t$ of each track separately according to distribution of positions that have pulses and are on each track, wherein the second index indicates, among all possible distribution situations corresponding to the first index I1, a distribution situation which corresponds to distribution of current positions having pulses on a corresponding track;

determining a third index $I3_t$ of each track separately according to the number of pulses on each position that has the pulse and is on each track;

generating a code index Ind, wherein the code index comprises information of the first index and the second and third indexes of each track;

wherein:

one first index corresponds to one $\{N_0, N_1, \ldots, N_{T-1}\}$ combination, or, at least one first index corresponds to more than two $\{N_0, N_1, \ldots, N_{T-1}\}$ combinations; for a track with a non-one $N_t$ value corresponding to the first index, besides determining second and third indexes of the track, an additional index corresponding to the number of current positions that have pulses and are on the track is further determined, the additional index corresponds to all possible distribution situations of positions that have pulses and are on the track under the number of positions having pulses, wherein the number of positions having pulses is represented by it, and the code index further comprises information of the additional index;

wherein the code index Ind is generated by adopting the following manner:

$$Ind = I1 + \text{Index}(0) \times \prod_{t=1}^{T-1} I_{max}(t) + \text{Index}(1) \times \prod_{t=2}^{T-1} I_{max}(t) + \ldots + \text{Index}(T-1);$$

wherein $I_{max}(t)$ represents an upper limit value of Index(t), "Π" represents multiplying, and Index(t) is generated by adopting the following manner:

in a situation in which a symbol index is not comprised, for a track with a one $N_t$ value corresponding to the first index:

$\text{Index}(t)=I2_t+I3_t \times C_{M_t}^{N_t}$, wherein "C" indicates acquiring the number of combinations, and $M_t$ represents the total number of positions on a $t^{th}$ track;

in a situation in which a symbol index is not comprised, for a track with a non-one $N_t$ value corresponding to the first index:

$\text{Index}(t)=If_t+I2_t+I3_t \times C_{M_t}^{N_t}$, wherein $If_t$ represents an additional index which is of a $t^{th}$ track and corresponds to a current $N_t$ value;

in a situation in which a symbol index is comprised, for a track with a one $N_t$ value corresponding to the first index:

$\text{Index}(t)=(I2_t+I3_t \times C_{M_t}^{N_t}) \times 2^{N_t}+Is_t$, wherein $Is_t$, represents a symbol index of a $t^{th}$ track, there are $N_t$ bits, and a value of each bit indicates pulse symbol information which is of a position that has a pulse and corresponds to the bit; and in a situation in which a symbol index is comprised, for a track with a non-one $N_t$ value corresponding to the first index:

$\text{Index}(t)=If_t+(I2_t+I3_t \times C_{M_t}^{N_t}) \times 2^{N_t}+Is_t$.

3. The method according to claim 1, wherein after the step of generating the code index, the method further comprises:

comparing the code index Ind with an adjustment threshold THR, wherein $$THR \le 2^{Bmax} - I_{max}(T),$$

$I_{max}(T)$ represents an upper limit value of Ind, and Bmax represents an upper limit value of the number of bits used for encoding the code index; and if Ind is smaller than THR, code bits, a number of which is a first number, are adopted to encode Ind; otherwise, code bits, the number of which is a second number, are adopted to encode Ind plus an offset value $THR_0$, wherein $THR \le THR_0 \le 2^{Bmax} - I_{max}(T)$, the first number is smaller than the second number, the second number is smaller than or equal to Bmax, and the first number and the second number are both positive integers.

4. The method according to claim 3, wherein correspondence between the first index and a $\{N_0, N_1, \ldots, N_{T-1}\}$ combination is determined by adopting the following manner: collecting statistics about a probability of occurrence of the $\{N_0, N_1, \ldots, N_{T-1}\}$ combination, to make a first index corresponding to a combination of a higher probability of occurrence be smaller.

5. The method according to claim 1, wherein the step of determining a third index $I3_t$ of each track separately according to the number of pulses on each position that has the pulses and is on each track comprises:

for the $t^{th}$ track, situations that $N_t$ positions having pulses have $\mathcal{N}_t$ pulses are mapped to situations that $N_t$ positions have $\mathcal{N}_t$-$N_t$ pulses, wherein $\mathcal{N}_t$ represents the total number of pulses required to be encoded on the $t^{th}$ track; and according to set order, all possible distribution situations of $\mathcal{N}_t$-$N_t$ pulses on $N_t$ positions are arrayed, and an arrayed serial number is used as the third index $I3_t$ indicating the number of pulses on a position that has a pulse.

6. The method according to claim 5, wherein a calculation formula of the third index $I3_t$ of each track is:

$$I3_t = C_{PPT}^{\Delta\mathcal{N}_t} - C_{PPT-q(0)}^{\Delta\mathcal{N}_t} + \sum_{h=1}^{\Delta\mathcal{N}_t-1} \left[C_{PPT-h-q(h-1)}^{\Delta\mathcal{N}_t-h} - C_{PPT-h-q(h)}^{\Delta\mathcal{N}_t-h}\right];$$

wherein $\Delta\mathcal{N}_t = \mathcal{N}_t$-$N_t$, $PPT=\mathcal{N}_t-1$, q(h) represents a position serial number of an $(h+1)^{th}$ pulse, $h \in [0, \Delta\mathcal{N}_t-1]$, $q(h) \in [0, N_t-1]$, $q(0) \le q(1) \le \ldots \le q(\Delta\mathcal{N}_t-1)$, or $q(0) \ge q(1) \ge \ldots \ge q(\Delta\mathcal{N}_t-1)$, and Σ indicates summation.

7. The method according to claim 1, wherein a calculation formula of the second index $I2_t$ of each track is:

$$I2_t = C_{M_t}^{N_t} - C_{M_t-p(0)}^{N_t} + \sum_{n=1}^{N_t-1} \left[C_{M_t-p(n-1)-1}^{N_t-n} - C_{M_t-p(n)}^{N_t-n}\right];$$

wherein $p_t(n)$ represents a position serial number of an $n^{th}$ position that has a pulse on a track, $n \in [0, N_t-1]$, $p_t(0) \in [0, M_t-N_t]$, $p_t(n) \in [p_t(n-1)+1, M_t-N_t+n]$, $p_t(0)<p_t(1)< \ldots <p_t(N_t-1)$, or $p_t(0)>p_t(1)> \ldots >p_t(N_t-1)$.

8. A pulse decoding method performed by a pulse decoder implemented by hardware, comprising:

obtaining a code index Ind, extracting a first index I1 from the code index, and determining, according to the first index I1, the number $\{N_0, N_1, \ldots, N_{T-}1\}$ of positions that have pulses and are on each track of T tracks, wherein the subscript t of Nt represents a $t^{th}$ track, $t \in [0, T-1]$, and T is an integer greater than or equal to 2;

extracting a second index I2t of each track and a third index I3t of each track from the code index;

wherein the first index I1 corresponds to all possible distribution situations of positions that have pulses and are on each track under the number of the positions having pulses, wherein the number of the positions having pulses is represented by it;

wherein the second index I2t indicates, among all possible distribution situations corresponding to the first index I1, a distribution situation which corresponds to distribution of current positions having pulses on a corresponding track;

for each track, according to the second index, determining distribution of positions that have pulses on the track under the number of positions having pulses, wherein the number of positions having pulses corresponds to the first index;

for each track, according to the third index, determining the number of pulses on each position that has pulse; and for each track, according to distribution of the positions that have pulses on the track and the number of pulses on each position that has the pulse, reconstructing a pulse sequence on the track.

9. The method according to claim 8, wherein the extracting the first index from the code index adopts: judging a value range to which the code index belongs among several set independent value ranges, and determining the first index according to a starting value corresponding to the value range to which the code index belongs.

10. The method according to claim 8, wherein:

one first index corresponds to one $\{N_0, N_1, \ldots, N_{T-1}\}$ combination, or, at least one first index corresponds to more than two $\{N_0, N_1, \ldots, N_{T-1}\}$ combinations; for a track with a non-one $N_t$ value corresponding to the first index, besides extracting the second and third indexes of the track, an additional index corresponding to the number of current positions that have pulses and are on the track is further extracted, and the additional index corresponds to all possible distribution situations of positions that have pulses and on the track under the number of positions having pulses, wherein the number of positions having pulses is represented by it.

11. The method according to claim 8, wherein the step of obtaining the code index Ind comprises:

extracting code bits, a number of which is a first number, from an encoded code stream;

if a decoded value of the code bits, the number of which is the first number, is smaller than an adjustment threshold THR, using the decoded value of the code bits, the number of which is the first number, as a code index Ind;

otherwise, increasing the number of extracted code bits to a second number, and using a value obtained by subtracting an offset value $THR_0$ from a decoded value of code bits, the number of which is the second number, as a code index Ind.

12. A pulse encoder implemented by hardware, comprising:

a pulse statistics unit, configured to obtain pulses that are on T tracks and required to be encoded, wherein T is an integer greater than or equal to 2; and separately collect, according to positions statistics about a pulse that is on each track and required to be encoded, to obtain the number $N_t$ of positions that have pulses on each track, distribution of the positions that have pulses on the track, and the number of pulses on each position that has a pulse, wherein the subscript t represents a $t^{th}$ track, and $t \in [0, T-1]$;

an index calculation unit, wherein the index calculation unit comprises: a first index unit, configured to, according to the number $\{N_0, N_1, \ldots, N_{T-1}\}$ of positions that have pulses and are on each track, output a first index I1, wherein the first index corresponds to all possible distribution situations of positions that have pulses and are on each track under the number of the positions having pulses, wherein the number of the positions having pulses is represented by it; a second index unit, configured to output a second index $I2_t$ of each track separately according to distribution of positions that have pulses and are on each track, wherein the second index indicates, among all possible distribution situations corresponding to the first index, a distribution situation which corresponds to distribution of current positions having pulses on a corresponding track; and a third index unit, configured to output a third index $I3_t$ of each track separately according to the number of pulses on each position that has a pulse and is on the track; and an index combination unit, configured to combine information of the first index I1 and the second and third indexes of each track to generate a code index Ind;

wherein at least one first index corresponds to more than two $\{N_0, N_1, \ldots, N_{T-1}\}$ combinations, the index calculation unit further comprises an additional index unit, configured to, for a track with a non-one $N_t$ value corresponding to the first index, determine an additional index corresponding to the number of current positions that have pulses and are on the track, wherein the additional index corresponds to all possible distribution situations of positions that have pulses and are on the track under the number of positions having pulses, wherein the number of positions having pulses is represented by it; and the index combination unit further combines information of the additional index into the code index.

13. The encoder according to claim 12, further comprising a code bit adjustment unit, configured to compare the code index Ind with an adjustment threshold THR after the index combination unit generates the code index, wherein $$THR \le 2^{Bmax} - I_{max}(T),$$

$I_{max}(T)$ represents an upper limit value of Ind, and Bmax represents an upper limit value of the number of bits used for encoding the code index; and if Ind is smaller than THR, code bits, a number of which is a first number, are adopted to encode Ind; otherwise, code bits, the number of which is a second number, are adopted to encode Ind plus an offset value $THR_0$, wherein $THR \le THR_0 \le 2^{Bmax} - I_{max}(T)$, the first number is smaller than the second number, the second number is smaller than or equal to Bmax, and the first number and the second number are both positive integers.

14. A pulse decoder implemented by hardware, comprising:

a first extraction unit, configured to obtain a code index Ind, extract a first index I1 from the code index, and determine, according to the first index I1, the number $\{N_0, N_1, \ldots, N_{T-1}\}$ of positions that have pulses and are on each track of T tracks, wherein the subscript t of $N_t$ represents a $t^{th}$ track, $t \in [0, T-1]$, and T is an integer greater than or equal to 2;

a second extraction unit, configured to extract a second index $I2_t$ of each track and a third index $I3_t$ of each track from the code index;

wherein the first index I1 corresponds to all possible distribution situations of positions that have pulses and are on each track under the number of the positions having pulses, wherein the number of the positions having pulses is represented by it;

wherein the second index $I2_t$ indicates, among all possible distribution situations corresponding to the first index I1, a distribution situation which corresponds to distribution of current positions having pulses on a corresponding track;

a first decoding unit, configured to, for each track, according to the second index, determine distribution of the positions that have pulses on the track under the number of positions having pulses, wherein the number of positions having pulses corresponds to the first index;

a second decoding unit, configured to, for each track, according to the third index, determine the number of pulses on each position that has a pulse; and a pulse reconstruction unit, configured to, for each track, according to distribution of the positions that have pulses on the track and the number of pulses on each position that has the pulse, reconstruct a pulse sequence on the track.

15. The decoder according to claim 14, wherein at least one first index corresponds to more than two $\{N_0, N_1, \ldots, N_{T-1}\}$ combinations, and the decoder further comprises:

an additional extraction unit, configured to, for a track with a non-one $N_t$ value corresponding to the first index, extract an additional index corresponding to the number of current positions that have pulses and are on the track, wherein the additional index corresponds to all possible distribution situations of positions that have pulses and are on the track under the number of positions having pulses, wherein the number of positions having pulses is represented by it; and the second extraction unit extracts the second index $I2_t$ of the track and the third index $I3_t$ of the track according to the number of current positions that have pulses and are on a corresponding track, wherein the number of current positions that have pulses and are on a corresponding track is determined by the additional index extracted by the additional extraction unit.

16. The decoder according to claim 14, further comprising a decoding bit adjustment unit, configured to extract code bits, a number of which is a first number, from an encoded code stream; if a decoded value of the code bits, the number of which is the first number, is smaller than an adjustment threshold THR, use the decoded value of the code bits, the number of which is the first number, as a code index Ind for output; otherwise, increase the number of extracted code bits to a second number, and use a value obtained by subtracting an offset value THR0 from a decoded value of code bits, the number of which is the second number, as a code index Ind for output.

17. A non-transitory computer readable storage medium, having stored thereon computer program code, which, when executed by a computer unit, causes the computer unit to perform a method comprising:

obtaining pulses that are on T tracks and required to be encoded, wherein T is an integer greater than or equal to 2;

separately collecting, according to positions, statistics about a pulse that is on each track and required to be encoded, to obtain the number $N_t$ of positions that have pulses on each track, distribution of the positions that have pulses on the track, and the number of pulses on each position that has a pulse, wherein the subscript t represents a $t^{th}$ track, and $t \in [0, T-1]$;

according to the number $\{N_0, N_1, \ldots, N_{T-1}\}$ of positions that have pulses and are on each track, determining a first index I1, wherein the first index I1 corresponds to all possible distribution situations of positions that have pulses and are on each track under the number of the positions having pulses, wherein the number of the positions having pulses is represented by it;

determining a second index $I2_t$ of each track separately according to distribution of positions that have pulses and are on each track, wherein the second index indicates, among all possible distribution situations corresponding to the first index I1, a distribution situation which corresponds to distribution of current positions having pulses on a corresponding track;

determining a third index $I3_t$ of each track separately according to the number of pulses on each position that has the pulse and is on each track; and generating a code index Ind, wherein the code index comprises information of the first index and the second and third indexes of each track;

wherein:

one first index corresponds to one $\{N_0, N_1, \ldots, N_{T-1}\}$ combination, or, at least one first index corresponds to more than two $\{N_0, N_1, \ldots, N_{T-1}\}$ combinations; for a track with a non-one $N_t$ value corresponding to the first index, besides determining second and third indexes of the track, an additional index corresponding to the number of current positions that have pulses and are on the track is further determined, the additional index corresponds to all possible distribution situations of positions that have pulses and are on the track under the number of positions having pulses, wherein the number of positions having pulses is represented by it, and the code index further comprises information of the additional index.

18. The non-transitory computer readable storage medium according to claim 17, wherein the code index Ind is generated by adopting the following manner:

$$Ind = I1 + \text{Index}(0) \times \prod_{t=1}^{T-1} I_{max}(t) + \text{Index}(1) \times \prod_{t=2}^{T-1} I_{max}(t) + \ldots + \text{Index}(T-1);$$

wherein $I_{max}(t)$ represents an upper limit value of Index(t), "Π" represents multiplying, and Index(t) is generated by adopting the following manner:

in a situation in which a symbol index is not comprised, for a track with a one $N_t$ value corresponding to the first index:

$\text{Index}(t) = I2_t + I3_t \times C_{M_t}^{N_t}$, wherein "C" indicates acquiring the number of combinations, and $M_t$ represents the total number of positions on a $t^{th}$ track;

in a situation in which a symbol index is not comprised, for a track with a non-one $N_t$ value corresponding to the first index:

$\text{Index}(t) = If_t + I2_t + I3_t \times C_{M_t}^{N_t}$, wherein $If_t$ represents an additional index which is of a $t^{th}$ track and corresponds to a current $N_t$ value;

in a situation in which a symbol index is comprised, for a track with a one $N_t$ value corresponding to the first index:

$\text{Index}(t) = (I2_t + I3_t \times C_{M_t}^{N_t}) \times 2^{N_t} + Is_t$, wherein $Is_t$ represents a symbol index of a $t^{th}$ track, there are $N_t$ bits, and a value of each bit indicates pulse symbol information which is of a position that has a pulse and corresponds to the bit; and in a situation in which a symbol index is comprised, for a track with a non-one $N_t$ value corresponding to the first index:

$\text{Index}(t) = If_t + (I2_t + I3_t \times C_{M_t}^{N_t}) \times 2^{N_t} + Is_t$.

19. The non-transitory computer readable storage medium according to claim 17, wherein after the step of generating the code index, the method further comprises:

comparing the code index Ind with an adjustment threshold THR, wherein $$THR \le 2^{Bmax} - I_{max}(T),$$

$I_{max}(T)$ represents an upper limit value of Ind, and Bmax represents an upper limit value of the number of bits used for encoding the code index; and if Ind is smaller than THR, code bits, a number of which is a first number, are adopted to encode Ind; otherwise, code bits, the number of which is a second number, are adopted to encode Ind plus an offset value $THR_0$, wherein $THR \le THR_0 \le 2^{Bmax} - I_{max}(T)$, the first number is smaller than the second number, the second number is smaller than or equal to Bmax, and the first number and the second number are both positive integers.

20. The non-transitory computer readable storage medium according to claim 19, wherein correspondence between the first index and a $\{N_0, N_1, \ldots, N_{T-1}\}$ combination is determined by adopting the following manner: collecting statistics about a probability of occurrence of the $\{N_0, N_1, \ldots, N_{T-1}\}$ combination, to make a first index corresponding to a combination of a higher probability of occurrence be smaller.

21. The non-transitory computer readable storage medium according to claim 17, wherein the step of determining a third index $I3_t$ of each track separately according to the number of pulses on each position that has the pulses and is on each track comprises:

for the $t^{th}$ track, situations that $N_t$ positions having pulses have $\mathcal{N}_t$ pulses are mapped to situations that $N_t$ positions have $\mathcal{N}_t$-$N_t$ pulses, wherein $\mathcal{N}_t$ represents the total number of pulses required to be encoded on the $t^{th}$ track; and according to set order, all possible distribution situations of $\mathcal{N}_t$-$N_t$ pulses on $N_t$ positions are arrayed, and an arrayed serial number is used as the third index $I3_t$ indicating the number of pulses on a position that has a pulse.

22. The non-transitory computer readable storage medium according to claim 21, wherein a calculation formula of the third index $I3_t$ of each track is:

$$I3_t = C_{PPT}^{\Delta\mathcal{N}_t} - C_{PPT-q(0)}^{\Delta\mathcal{N}_t} + \sum_{h=1}^{\Delta\mathcal{N}_t-1} \left[C_{PPT-h-q(h-1)}^{\Delta\mathcal{N}_t-h} - C_{PPT-h-q(h)}^{\Delta\mathcal{N}_t-h}\right];$$

wherein $\Delta\mathcal{N}_t=\mathcal{N}_t$-$N_t$, $PPT=\mathcal{N}_t-1$, q(h) represents a position serial number of an $(h+1)^{th}$ pulse, $h\in[0, \Delta\mathcal{N}_t-1]$, $q(h)\in[0, N_t-1]$, $q(0)\leq q(1)\leq \ldots \leq q(\Delta\mathcal{N}_t-1)$, or $q(0)\geq q(1)\geq \ldots \geq q(\Delta\mathcal{N}_t-1)$, and Σ indicates summation.

23. The non-transitory computer readable storage medium according to claim 17, wherein a calculation formula of the second index $I2_t$ of each track is:

$$I2_t = C_{M_t}^{N_t} - C_{M_t-p_t(0)}^{N_t} + \sum_{n=1}^{N_t-1} \left[C_{M_t-p_t(n-1)-1}^{N_t-n} - C_{M_t-p_t(n)}^{N_t-n}\right];$$

wherein $p_t(n)$ represents a position serial number of an $n^{th}$ position that has a pulse on a track, $n\in[0, N_t-1]$, $p_t(0)\in[0, M_t-N_t]$, $p_t(n)\in[p_t(n-1)+1, M_t-N_t+n]$, $p_t(0)<p_t(1)<\ldots<p_t(N_t-1)$, or $p_t(0)>p_t(1)>\ldots>p_t(N_t-1)$.

24. A non-transitory computer readable storage medium, having stored thereon computer program code, which, when executed by a computer unit, causes the computer unit to perform a method comprising:

obtaining a code index Ind, extracting a first index I1 from the code index, and determining, according to the first index I1, the number $\{N_0, N_1, \ldots, N_{T-1}\}$ of positions that have pulses and are on each track of T tracks, wherein the subscript t of $N_t$ represents a $t^{th}$ track, $t\in[0, T-1]$, and T is an integer greater than or equal to 2;

extracting a second index $I2_t$ of each track and a third index $I3_t$ of each track from the code index;

wherein the first index I1 corresponds to all possible distribution situations of positions that have pulses and are on each track under the number of the positions having pulses, wherein the number of the positions having pulses is represented by it;

wherein the second index $I2_t$ indicates, among all possible distribution situations corresponding to the first index I1, a distribution situation which corresponds to distribution of current positions having pulses on a corresponding track;

for each track, according to the second index, determining distribution of positions that have pulses on the track under the number of positions having pulses, wherein the number of positions having pulses corresponds to the first index;

for each track, according to the third index, determining the number of pulses on each position that has pulse; and for each track, according to distribution of the positions that have pulses on the track and the number of pulses on each position that has the pulse, reconstructing a pulse sequence on the track.

25. The non-transitory computer readable storage medium according to claim 24, wherein the extracting the first index from the code index adopts: judging a value range to which the code index belongs among several set independent value ranges, and determining the first index according to a starting value corresponding to the value range to which the code index belongs.

26. The non-transitory computer readable storage medium according to claim 24, wherein:

one first index corresponds to one $\{N_0, N_1, \ldots, N_{T-1}\}$ combination, or, at least one first index corresponds to more than two $\{N_0, N_1, \ldots, N_{T-1}\}$ combinations; for a track with a non-one $N_t$ value corresponding to the first index, besides extracting the second and third indexes of the track, an additional index corresponding to the number of current positions that have pulses and are on the track is further extracted, and the additional index corresponds to all possible distribution situations of positions that have pulses and on the track under the number of positions having pulses, wherein the number of positions having pulses is represented by it.

27. The non-transitory computer readable storage medium according to claim 24, wherein the step of obtaining the code index Ind comprises:

extracting code bits, a number of which is a first number, from an encoded code stream;

if a decoded value of the code bits, the number of which is the first number, is smaller than an adjustment threshold THR, using the decoded value of the code bits, the number of which is the first number, as a code index Ind;

otherwise, increasing the number of extracted code bits to a second number, and using a value obtained by subtracting an offset value $THR_0$ from a decoded value of code bits, the number of which is the second number, as a code index Ind.

* * * * *